(12) United States Patent
Van Stralen et al.

(10) Patent No.: US 6,304,996 B1
(45) Date of Patent: Oct. 16, 2001

(54) HIGH-SPEED TURBO DECODER

(75) Inventors: Nick Andrew Van Stralen; John Anderson Fergus Ross, both of Schenectady; Stephen Michael Hladik, Albany; Abdallah Mahmoud Itani, Ballston Spa; Robert Gideon Wodnicki, Schenectady, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/263,566

(22) Filed: Mar. 8, 1999

(51) Int. Cl.$^7$ .................................................. H03M 13/03
(52) U.S. Cl. .......................................... 714/796; 714/794
(58) Field of Search ..................................... 714/786, 794, 714/796

(56) References Cited

U.S. PATENT DOCUMENTS

| | | |
|---|---|---|
| Re. 32,905 | 4/1989 | Baran . |
| 5,349,589 | 9/1994 | Chennakeshu et al. . |
| 5,406,570 | 4/1995 | Berrou et al. . |
| 5,446,747 | 8/1995 | Berrou . |
| 5,721,745 * | 2/1998 | Hladik et al. ........................ 714/755 |
| 5,721,746 * | 2/1998 | Hladik et al. ........................ 714/792 |
| 5,734,962 * | 3/1998 | Hladik et al. ........................ 455/12.1 |
| 6,000,054 * | 12/1999 | Bahr et al. ........................... 714/786 |
| 6,014,411 * | 1/2000 | Wang .................................. 375/259 |
| 6,023,783 * | 2/2000 | Divsalar et al. ..................... 714/792 |
| 6,028,897 * | 3/2000 | Wang .................................. 375/265 |
| 6,044,116 * | 2/2000 | Wang .................................. 375/265 |

FOREIGN PATENT DOCUMENTS 0 735 696   10/1996  (EP) .
2 675 970   10/1992  (FR) .

OTHER PUBLICATIONS

D. Divsalar and F. Pollara, "Hybrid Concatenated Codes and Iterative Decoding", TDA Progress Report 42–130, Jet Propulsion Laboratory, NASA, Aug. 15, 1997.*

S. Benedetto, D. Divsalar, G. Montorsi, and F. Pollara, "A Soft–Input Soft–Output Maximum A Posteriori MAP Module to Decode Parallel and Serial Concatenated Codes", TDA Progress Report 42–127, Jet Propulsion Laboratory, NASA, Nov. 15, 1996.*

Patrick Robertson, Emmanuelle Villebrun and Peter Hoecher, "A Comparison of Optimal and Sub–Optimal MAP Decoding Algorithms Operating in the Log Domain", IEEE 1995.*

(List continued on next page.)

Primary Examiner—Albert Decady
Assistant Examiner—Joseph Torres
(74) Attorney, Agent, or Firm—Jill M. Breedlove; Douglas E. Stoner

(57) ABSTRACT

A high-speed turbo decoder utilizes a MAP decoding algorithm and includes a streamlined construction of functional units, or blocks, amenable to ASIC implementation. A gamma block provides symbol-by-symbol a posteriori state transition probability estimates. Two gamma probability function values are provided via selection switches to the alpha and beta blocks for calculating the alpha and beta probability function values, i.e., performing the alpha and beta recursions, respectively, in parallel, thus significantly increasing decoding speed. A scaling circuit monitors the values of the alpha and beta probability functions and prescribes a scale factor such that all such values at a trellis level remain within the precision limits of the system. A sigma block determines the a posteriori state transition probabilities (sigma values) and uses the sigma values to provide soft-decision outputs of the turbo decoder.

1 Claim, 16 Drawing Sheets

OTHER PUBLICATIONS

Patrick Robertson, "Illuminating the Structure of Code and Decoder of Parallel Concatenated Recursive Systematic Turbo Codes", IEEE 1994.*

Patrick Robertson, "Improving Decoder and Code Structure of Parallel Concatenated Recursive Systematic Turbo Codes", IEEE 1994.*

Sven Riedel, "MAP Decoding of Convolutional Codes Using Reciprocal Dual Codes", IEEE Transactions on Information Theory, vol. 44, No. 3, May 1998.*

S. Benedetto, D. Divsalar, G. Montorsi and F. Pollara; "Soft-Output Decoding Algorithms in Iterative Decoding of Turbo Codes"; TDA Progress Report 42–124, Jet Propulsion Laboratory, NASA, Feb. 15, 19.*

Jakob Dahl Andersen, "The Turbo Coding Scheme", Report IT–146, ISSN 0105–854, Institute of Telecommunication, Technical University of Denmark, Dec. 1994.*

Claude Berrou and Alain Glavieux, "Near Optimum Error Correcting Coding And Decoding: Turbo–Codes", IEEE Transactions on Communications, vol. 44, No. 10, Oct. 1996.*

Sven Riedel, "Symbol–by–Symbol MAP Decoding Algorithm for High–Rate Convolutional Codes That Use Reciprocal Dual Codes", IEEE Journal on Selected Areas in Communications, vol. 16, No. 2, Feb. 1998.*

"Turbo Code Decoder with Controlled Probability Estimate Feedback," JAF Ross; SM Hladik; NA VanStralen, JB Anderson, Ser. No. 09/137,257 (GE docket RD–25781), filed Aug. 20, 1998.

"Turbo Code Decoder with Modified Systematic Symbol Transition Probabilities," SM Hladik; JAF Ross; NA VanStralen; Ser. No. 09/137,256 (GE docket RD–26016), filed Aug. 20, 1998.

"A Maximum a Posteriori Estimator with a Fast Sigma Calculator," JAF Ross; AM Itani; NA VanStralen; SM Hladik; Ser. No. 09/137,260 (GE docket RD–26035), filed Aug. 20, 1998.

"High–Data Rate Maximum a Posteriori Decoder for Segmented Trellis Code Words," SM Hladik; NA VanStralen; JAF Ross; Ser. No. 09/137,181 (GE docket RD–26064), filed Aug. 20, 1998.

"Source and Channel Coding, an Algorithmic Approach," John B. Anderson; Seshadri Mohan, pp. 216, 336–342.

"Decision Depths of Convolutional Codes," John B. Anderson; Kumar Balachandran; IEEE Transactions on Information Theory, vol. 35, No. 2, Mar. 1989, pp. 455–459.

"The Turbo Coding Scheme," Jakob Dahl Anderson, Report IT–146 ISSN 0105–854, Jun. 1994, Revised Dec. 1994, pp. 1–48.

"An Efficient Adaptive Circular Viterbi Algorithm for Decoding Generalized Tailbiting Convolutional Codes," Richard V. Cox, Car–Erik W. Sundberg; IEEE Transactions on Vehicular Technology, vol. 43, No. 1, Feb. 1994, pp. 57–68.

"On Tail Biting Convolutional Codes," Howard H. Ma; Jack K. Wolf, IEEE Transactions on Communications, vol. Com–34, No. 2, Feb., 1990, pp. 104–111.

"An Efficient Maximum Likelihood Decoding Algorithm for Generalized Tailbiting Convolutional Codes Including Quasicyclic Codes," Qiang Wang and Vijay K. Bhargava, IEEE Transactions on Communications, vol. 37, No. 8, Aug. 1989, pp. 875–879.

"Illuminating the Structure of Code and Decoder of Parallel Concatenated Recursive Systematic (TURBO) Codes," Patrick Robertson, IEEE, 1994, pp. 1298–1303.

"Near Shannon Limit Error–Correcting Coding and Decoding: Turbo–Codes (1)," Claude Berrou, Alain Glavieux, Punya Thitimajshima, IEEE, 1993, pp. 1064–1070.

"Optimal Decoding of Linear Codes for Minimizing Symbol Error Rate," LR Bahl; J Cocke; F. Jelinek; J. Raviv; IEEE Transactions on Information Theory, Mar. 1974, pp. 284–287.

"Near Optimum Error Correcting Coding and Decoding: Turbo–Codes," Claude Berrou; IEEE Transactions on Communications, vol. 44, No. 10, Oct. 1996, pp. 1261–1271.

"A Comparison of Optimal and Sub–Optimal Map Decoding Algorithms Operating in the Log Domain," Patrick Robertson; Emmanuelle Villebrun; Peter Hoeher; IEEE 1995, pp. 1009–1013.

"Terminating the Trellis of Turbo–Codes in the Same State," AS Barbulescu; SS Pietrobon, Electronics Letters $5^{th}$ Jan., 1995 vol. 31, No. 1, pp. 22–23.

"Terminating the Trellis of Tubo–Codes," O. Joerssen; H. Meyr; Electronics Letters $4^{th}$ Aug., 1994 vol. 30, No. 16, pp. 1285–1286.

"A Viterbi Algorithm with Soft–Decision Outputs and its Applications," Joachim Hagenauer; Peter Hoeher; IEEE 1989, pp. 1680–1686.

\* cited by examiner

HIGH-SPEED TURBO DECODER

BACKGROUND OF THE INVENTION

The present invention relates generally to error-correction coding and, more particularly, to a decoder for parallel concatenated codes, e.g., turbo codes.

A new class of forward error control codes, referred to as turbo codes, offers significant coding gain for power limited communication channels. Turbo codes are generated using two recursive systematic encoders operating on different permutations of the same information bits. A subset of the code bits generated by each encoder is transmitted in order to maintain bandwidth efficiency. Turbo decoding involves an iterative algorithm in which probability estimates of the information bits that are derived for one of the codes are fed back to a probability estimator for the other code. Each iteration of processing generally increases the reliability of the probability estimates. This process continues, alternately decoding the two code words until the probability estimates can be used to make reliable decisions.

The maximum a posteriori (MAP) type algorithm introduced by Bahl, Cocke, Jelinek, and Raviv in "Optimal Decoding of Linear Codes for Minimizing Symbol Error Rate", *IEEE Transactions on Information Theory*, March 1974, pp. 284–287, is particularly useful as a component decoder in decoding parallel concatenated convolutional codes, i.e., turbo codes. The MAP algorithm is used in the turbo decoder to generate a posteriori probability estimates of the systematic bits in the code word. These probability estimates are used as a priori symbol probability estimates for the second MAP decoder. Three fundamental terms in the MAP algorithm are the forward and backward state probability functions (the alpha and beta functions, respectively) and the a posteriori transition probability estimates (the sigma function).

It is desirable to provide a turbo decoder which efficiently uses memory and combinatorial logic such that the structure thereof is highly streamlined with parallel signal processing. It is further desirable to provide such a structure which is amenable to implementation on an application specific integrated circuit (ASIC).

BRIEF SUMMARY OF THE INVENTION

A high-speed turbo decoder utilizes a MAP decoding algorithm and comprises a streamlined construction of functional units, or blocks, amenable to ASIC implementation. The turbo decoder comprises a gamma block, alpha and beta blocks, and a sigma block. The gamma block provides symbol-by-symbol a posteriori state transition probability estimates (values of the gamma probability function), only four non-zero gamma probability function values being possible at any particular trellis level. Two gamma probability function values are provided via selection switches to the alpha and beta blocks for calculating the alpha and beta probability function values, i.e., performing the alpha and beta recursions, respectively, in parallel, thus significantly increasing decoding speed. The alpha and beta blocks have as many state update circuits as there are states in the trellis. A scaling or normalization circuit monitors the values of the alpha and beta probability functions and prescribes a scale factor such that all such values at a trellis level remain within the precision limits of the system. Previously calculated values of these probability functions are used for the normalization calculation in order to remove the normalization calculation from the critical path in the alpha and beta blocks and thus increase decoding speed. The outputs of the alpha and beta blocks are buffered and provided as inputs to the sigma block. The sigma block determines the a posteriori state transition probability estimates (sigma values) and uses the sigma values to provide the a posteriori bit probability estimates, i.e., the soft-decision outputs of the turbo decoder.

BRIEF DESCRIPTION OF THE DRAWINGS

FIG. 8b is a block diagram illustrating a soft limiter function suitable for use in the update circuit of FIG. 8a;

DETAILED DESCRIPTION OF THE INVENTION

Turbo Decoder Structure

The MAP decoder uses the received sequence $Y_1^\tau$ to estimate the a posteriori state and transition probabilities of a Markov source.

$$\Pr\{S_t=m|Y_1^\tau\}=\Pr\{S_t=m;Y_1^\tau\}/\Pr\{Y_1^\tau\}=\lambda_t(m)/\Pr\{Y_1^\tau\} \qquad 1$$

and $$\Pr\{S_{t-1}=m';S_t=m|Y_1^\tau\}=\Pr\{S_{t-1}=m';S_t=m;\ Y_1^\tau\}/\Pr\{Y_1^\tau\}=\sigma_t(m',m)/\Pr\{Y_1^\tau\} \qquad 2$$

The joint probability estimates $\lambda_t(m)$ and $\sigma_t(m',m)$ are computed and normalized such that their sum adds to one, resulting in the desired state and transition probability estimates.

The alpha, beta and gamma functions are set forth as follows:

$$\alpha_t(m)=\Pr\{S_t=m;\ Y_1^t\} \qquad 3$$

$$\beta_t(m)=\Pr\{Y_{t+1}^\tau|S_t=m\} \qquad 4$$

and $$\gamma_t(m',m)=\Pr\{S_t=m;Y_t|S_{t-1}=m'\} \qquad 5$$

so that $$\lambda_t(m)=\alpha_t(m)\cdot\beta_t(m) \qquad 6$$

and the a posteriori state transition probabilities are determined as follows:

$$\tau_t(m',m)=\alpha_{t-1}(m')\cdot\gamma_t(m',m)\cdot\beta_t(m) \qquad 7$$

The alpha function is computed from the following recursion:

$$a_t(m) = \sum_{m'} \alpha_{t-1}(m') \cdot \gamma_t(m', m). \qquad 8$$

The beta function is calculated using the following recursion:

$$\beta_t(m) = \sum_{m'} \beta_{t+1}(m') \cdot \gamma_{t+1}(m, m'). \qquad 9$$

Finally, the gamma function is defined as follows:

$$\gamma_t(m', m) = \sum_X p_t(m \mid m') \cdot q_t(X \mid m', m) \cdot R(Y_t \mid X), \qquad 10$$

where $p_t(m|m')$ are the Markov transition probabilities, and $q_t(X|m',m)$ is the distribution of the source's output symbols.

Turbo codes are constructed as two recursive systematic codes concatenated in parallel. A MAP decoder for a turbo code generates a probability estimate of the systematic bits in a code word, based on one of the two recursive systematic codes, and provides this information to a second MAP decoder which decodes the other component code of the turbo code. The second decoder uses these probability estimates as a priori information and generates new estimates of the systematic bits in the code word. The updated estimates are provided to the first MAP decoder, which in turn, generates updated estimates. This feedback process continues a finite number of times, and a decision on the systematic bits is made based on the final probability estimates. One decoding of each component code word comprising a turbo code word is referred to as a decoding iteration; a typical number of iterations is eight.

The two parallel codes in a turbo code are referred to herein as the top code and the bottom code. Normally, the data is encoded by the top code and is interleaved using either a fixed block interleaver or a random interleaver before being encoded by the bottom code. A random interleaver is usually preferred since the coding gain is higher with the same (interleaved) block length.

Figure 1:
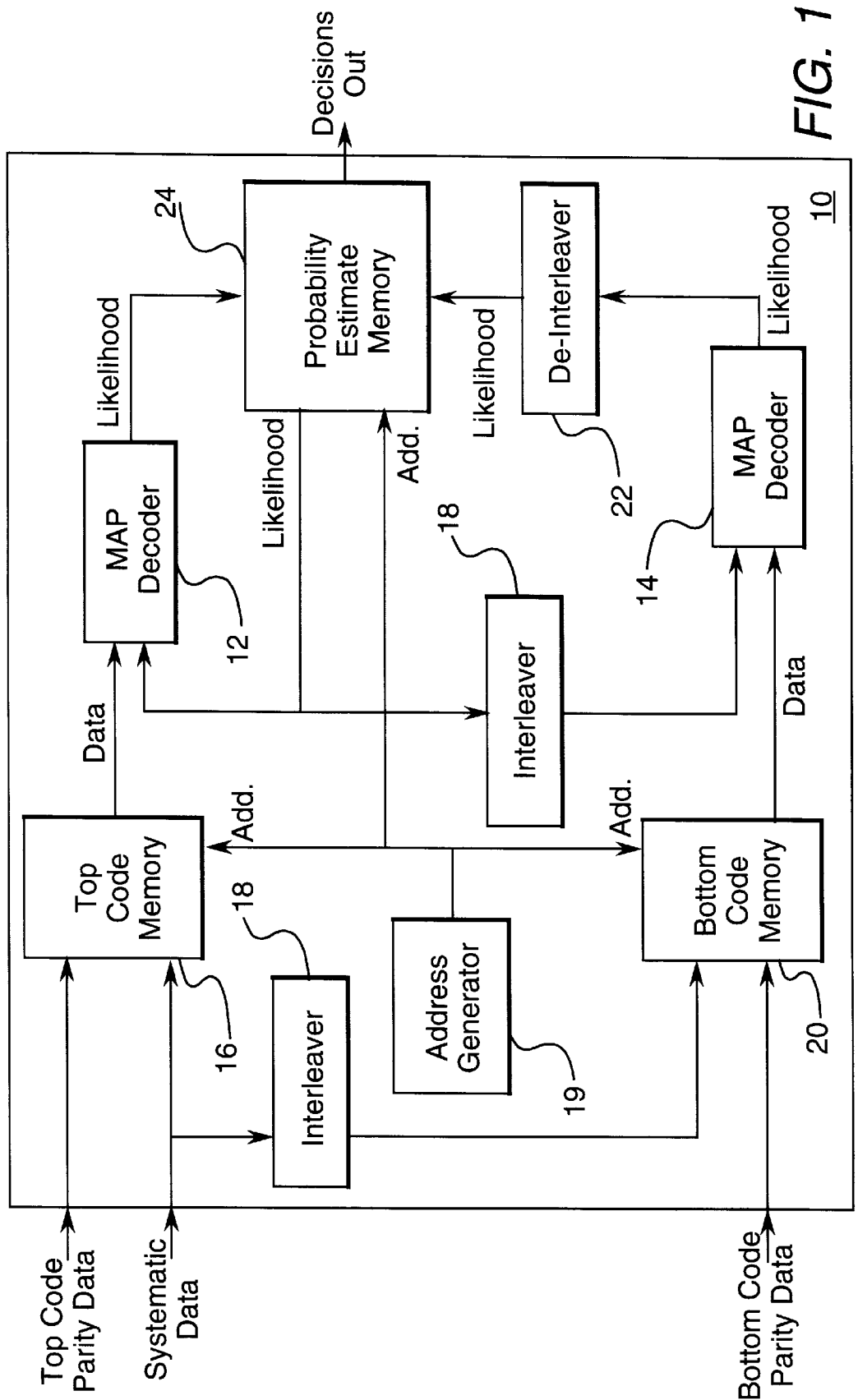
FIG. 1 is a block diagram illustrating the general structure of a turbo decoder employing a MAP decoding algorithm.

FIG. 1 illustrates a turbo decoder employing component MAP decoders 12 and 14. As shown, the top code parity data is provided along with the systematic data to a top code memory 16 and then to MAP decoder 12. The systematic data is also provided, via an interleaver 18, along with the bottom code parity data to a bottom code memory 20 and then to the second MAP decoder 14. FIG. 1 also shows the feedback loop involving MAP decoders 12 and 14, interleaver 18, address generator 19, de-interleaver 22, and a probability estimate memory 24 for implementing a MAP decoding algorithm as described hereinabove.

The systematic bit probability estimates are computed using the a posteriori transition or $\sigma_t(m',m)$ probabilities. The sum of all a posteriori transition probabilities corresponding to trellis branches which are labeled with the same data bit value is the a posteriori probability that such data bit value is the correct decoded bit value. The output of a MAP component decoder is an a posteriori probability estimate of the systematic symbols, denoted as $APP_t(0)$ and $APP_t(1)$, as set forth in the following expression:

$$APP_t(k) = \Pr\{d_t = k \mid Y_1^\tau\} \qquad 11$$
$$= \sum \sigma_t(m', m)$$

where the summation is over all $\sigma_t(m',m)$ values where the systematic bit corresponding to the transition (m',m) is k.

The MAP decoding algorithm is a memory intensive and computationally intensive algorithm due primarily to the alpha and beta functions. The alpha and beta functions are recursive operations which begin at opposite ends of the received sequence. Normally, the alpha function would be computed first; then the beta function and sigma function would be calculated. In preferred embodiments of the present invention, the alpha and beta function values are calculated in parallel.

The alpha function is defined by the following recursion:

$$a_t(m) = \sum_{m'} \alpha_{t-1}(m') \cdot \gamma_t(m', m) \qquad 12$$

where the summation is over all states where the transition (m',m) exists.
and the beta recursion is defined as follows:

$$\beta_t(m) = \sum_{m'} \beta_{t+1}(m') \cdot \gamma_{t+1}(m, m'), \qquad 13$$

where the summation is over all states where the transition (m,m') exists. The alpha and beta functions must be computed for all states (m) and for all trellis levels (t).

For example, for systematic codes with binary input symbols, the number of terms in the summation is two; and for typical turbo codes, the number of states is sixteen, and the number of trellis levels is greater than two hundred. Assuming a sixteen-state trellis and eight iterations of decoding, a parallel multiplication followed by an addition function must be executed five hundred twelve times for each trellis level. The decoding of each trellis level only yields a single bit of user information.

Equations 12 and 13 indicate that the alpha (beta) recursions depend on the previous values of the alpha (beta)

recursion and the $y_{t+1}(m',m)$(gamma) function. The quantity $y_{t+1}(m'm)$ is the joint probability of state m at time t and of receiving symbol $Y_t$, given that the state at time t-1 was m' and can be computed as $$\gamma_t(m', m) = \sum_X p_t(m \mid m') \cdot q_t(X \mid m', m) \cdot R(Y_t \mid X_t) \qquad 14$$

In a recursive systematic code, a single transition (m',m) determines a specific channel symbol $X_t$ so that the summation is eliminated and the function $q_t(X|m',m)$ is identically equal to one. Also, for a rate one-half code and binary signaling, the channel transition probabilities are computed as the product of two one-dimensional transition probability estimates for the information and parity bits as follows:

$$R(Y_t|X_t) = R(Y_{t_i}|X_{t_i})R(Y_{t_p}|X_{t_p}), \qquad 15$$

assuming a memoryless channel.

The transition probability $p_t(m|m')$ is zero for invalid transitions and is otherwise equal to the a prior bit probability.

$$\gamma_t(m', m) = 0 \text{ when } p_t(m \mid m') = 0 \qquad 16$$
$$= AP_t(0) \cdot R(Y_{t_i} \mid 0) \cdot R(Y_{t_p} \mid X_{t_p}) \text{ when } (X_{t_i} \mid m', m) = 0$$
$$= AP_t(1) \cdot R(Y_{t_i} \mid 1) \cdot R(Y_{t_p} \mid X_{t_p}) \text{ when } (X_{t_i} \mid m', m) = 1$$

where $AP_t(k)$ is the a priori probability for the systematic bit at trellis level t. $X_{t_p}$ can assume only a 0 or 1 value so that, at any trellis level, there can be only four possible non-zero values for gamma.

$$\gamma_{t,00}(m',m) = AP_t(0) \cdot R(Y_{t_i}|0) \cdot R(Y_{t_p}|0)$$
$$\gamma_{t,01}(m',m) = AP_t(0) \cdot R(Y_{t_i}|0) \cdot R(Y_{t_p}|1)$$
$$\gamma_{t,10}(m',m) = AP_t(1) \cdot R(Y_{t_i}|1) \cdot R(Y_{t_p}|0)$$
$$\gamma_{t,11}(m',m) = AP_t(1) \cdot R(Y_{t_i}|1) \cdot R(Y_{t_p}|1)$$

For a logarithmic implementation, equations 17 are rewritten as follows:

$$\ln\gamma_{t,00}(m',m) = \ln AP_t(0) + \ln R(Y_{t_i}|0) + \ln R(Y_{t_p}|0)$$
$$\ln\gamma_{t,01}(m',m) = \ln AP_t(0) + \ln R(Y_{t_i}|0) + \ln R(Y_{t_p}|1)$$
$$\ln\gamma_{t,10}(m',m) = \ln AP_t(1) + \ln R(Y_{t_i}|1) + \ln R(Y_{t_p}|0)$$
$$\ln\gamma_{t,11}(m',m) = \ln AP_t(1) + \ln R(Y_{t_i}|1) + \ln R(Y_{t_p}|1)$$

Figure 2:
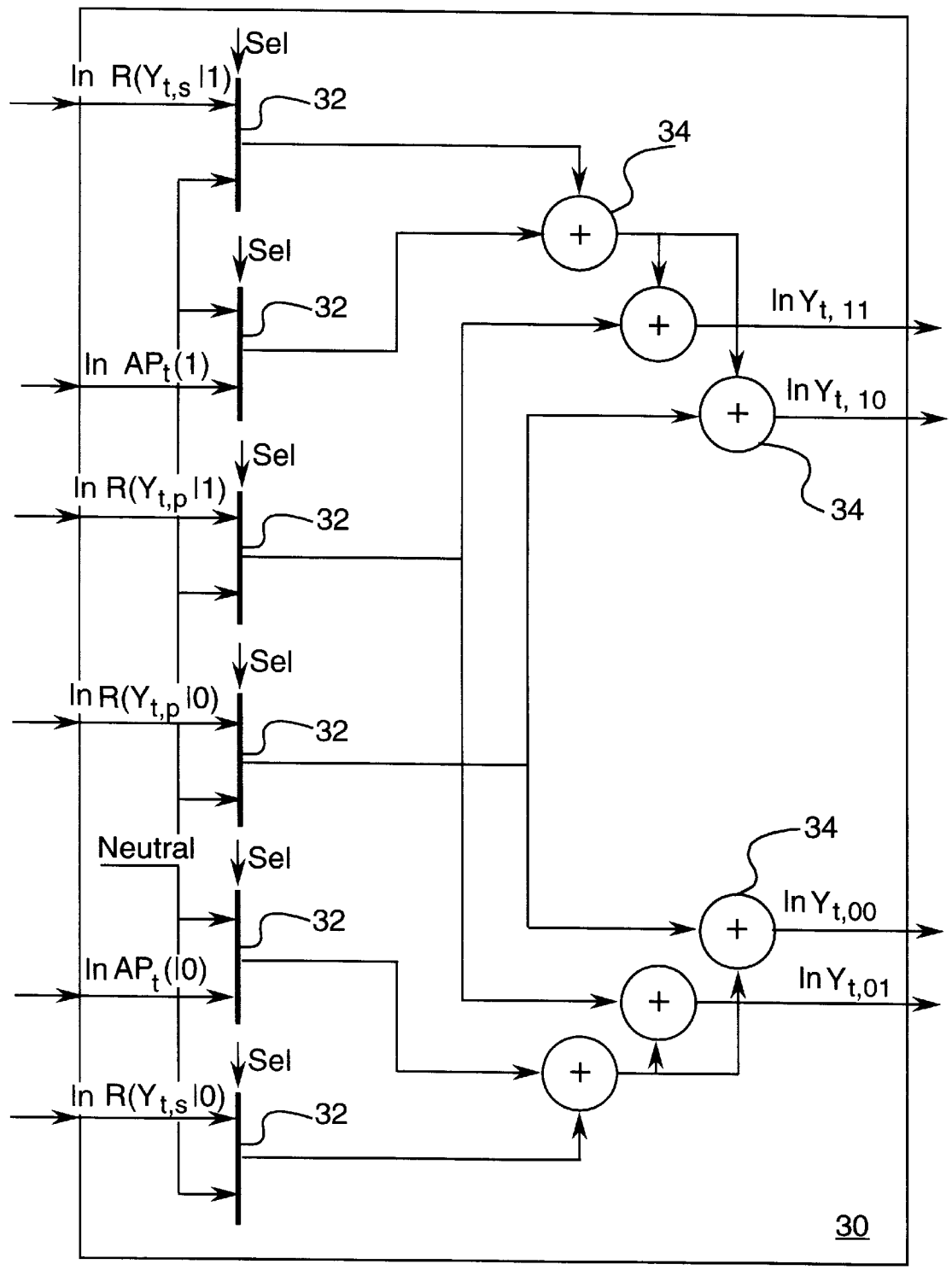
FIG. 2 is a block diagram illustrating a gamma calculator of a turbo decoder according to a preferred embodiment of the present invention.

These four gamma values depend only on the a priori bit probability and the received symbol for the trellis level. All four values are used multiple times in the alpha and beta r ecursions. FIG. 2 illustrates a gamma calculator circuit 30 for computing the gamma values set forth in equations 18. As shown, the inputs to the gamma calculator are the logarithms of the channel transition probabilities, $R(Y_{t_i}|0)$, $R(Y_{t_i}|1)$, $R(Y_{t_p}|0)$, $R(Y_{t_p}|1)$; and the logar ithms of the a priori bit probabilities are $AP_t(0)$ and $AP_t(1)$. FIG. 2 illustrates selection switches 32 and adders 34 for implementing equations 18.

The computation of the channel transition probability function $R(\cdot|\cdot)$ is performed using a look-up table. For example, if the input data $Y_t$ is quantized to sixty-four levels, a look-up table containing the one hundred twenty-eight different values (64 for $X_t=0$ and 64 for $X_t=1$) of the function $R(\cdot|\cdot)$ can be computed in advance and stored in memory.

When a specific value of the channel transition probability function is required, the pre-computed value can be read from the table and provided to the gamma calculator. The memory required to store the one hundred twenty-eight table elements is small, and any performance loss due to sixty-four-level (six-bit) quantization of the inputs is minimal.

The size of the table can be reduced to half of the size described hereinabove by exploiting the symmetry of the channel probability functions about the value 0.5. To this end, a table containing the values R(y|1) and R(y|0) for only either y>0.5 or y<0.5. is required. Assuming that the received data is sampled symmetrically about the 0.5 value, the size of each table contains only 32 values. And assuming that the tables are loaded with the channel probability values for y>0.5, and an input sample of a value less than 0.5 is received, then the required R(y|1) and R(y|0) arey using the lookup tables to find the values R(0.5−y|1) and R(0.5−y|0) and using the relations R(y|1)=R(0.5−y|0) and R(y|0)=R(0.5−y|1). The implementation of this reduction in the size of the table requires an absolute value function to compute 0.5−y if y is less than 0.5, and multiplexers to direct the outputs of the lookup tables to R(y|1) and R(y|0).

The total memory required in the probability tables can be further reduced by half by scaling the tables so that for each value of y, one of the R(y|1) or R(y|0) values is exactly unity. In the case where the decoder is implemented in the log-domain (ln(1)=0), one of the values is identically zero. With the scaling of tables described hereinabove, the table containing the probability values for R(y|1) will contain all ones (zeros for the log-domain decoder). This table can then be eliminated from the channel probability calculation circuit. The scaling introduced to the tables does not affect decoding performance because the decoder makes bit probability estimates based on the ratios of probabilities and not on the absolute probabilities.

In the case where the channel probability distribution is Gaussian and the decoder is implemented in the log-domain, it is possible to replace the above mentioned lookup table with a multiply circuit.

The ratio of R(y|1) and R(y|0) in the log-domain can be computed as $$\log\left[\frac{R(y \mid 1)}{R(y \mid 0)}\right] = \log\left[\frac{\frac{1}{\sigma\sqrt{2\pi}}\exp\left(\frac{(y-1)^2}{2\sigma^2}\right)}{\frac{1}{\sigma\sqrt{2\pi}}\exp\left(\frac{(y-0)^2}{2\sigma^2}\right)}\right]$$
$$= \log\left[\exp\left(\frac{(y-1)^2}{2\sigma^2} - \frac{(y-0)^2}{2\sigma^2}\right)\right]$$
$$= \frac{(y-1)^2}{2\sigma^2} - \frac{(y-0)^2}{2\sigma^2}$$
$$= \frac{(y^2 - 2y + 1) - (y^2)}{2\sigma^2}$$
$$= -\frac{\left(y + \frac{1}{2}\right)}{\sigma^2}$$

One coefficient in the multiplication is $$\frac{1}{\sigma^2}$$

while the (y+½) term represents the input data samples.

Figure 3:
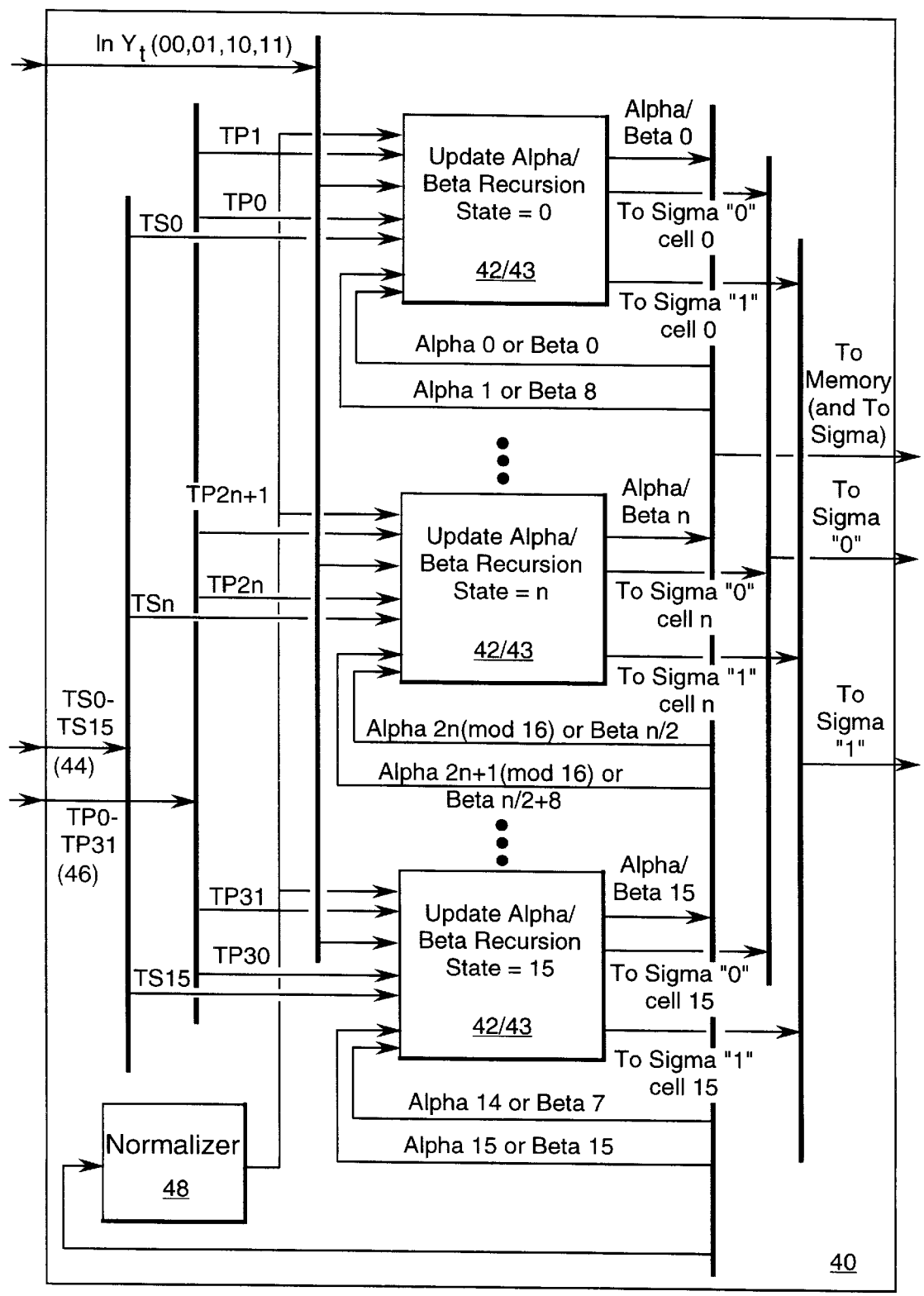
FIG. 3 is a block diagram illustrating an alpha and beta block of a turbo decoder according to a preferred embodiment of the present invention.
Figure 6:
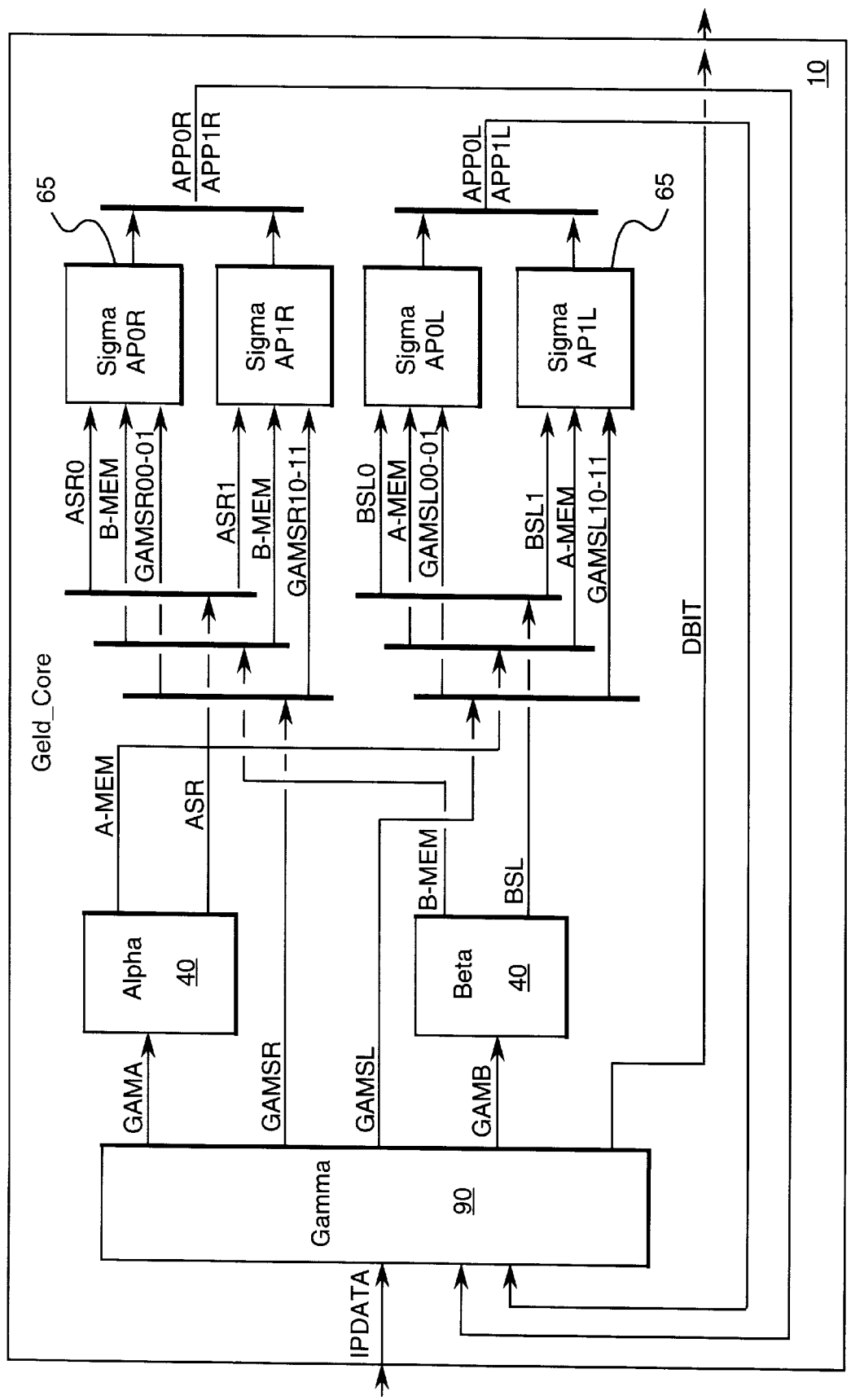
FIG. 6 is a block diagram illustrating the data flow for a turbo decoder according to a preferred embodiment of the present invention.

In a preferred embodiment of the invention, the gamma values from gamma calculator 30 are provided to circuits used to compute the alpha and beta functions, i.e., alpha and beta blocks 40 wherein the alpha and beta values for each state in the trellis are calculated in parallel, as illustrated in FIG. 3. This parallel architecture significantly increases decoding speed compared to calculating the alpha and beta values for each state in series since the alpha and beta recursions fundamentally limit the computation speed of the MAP decoding algorithm. A single update of an alpha (or beta) value involves both the multiplication of two previous alpha (or beta) values by the appropriate probability estimates and the summation of these products. In general, these computations must be completed for all states in the trellis before the recursion for the next trellis level can start. Such parallel processing requires as many state update circuits 42 (or 43) (two parallel multiplications followed by an addition) as there are states in the trellis. To minimize the delay caused by the alpha and beta recursions, the alpha and beta recursions are performed in parallel (as shown in FIG. 6 described hereinbelow), requiring a separate computational block 40 for each. For example, thirty-two parallel multiply-and-add circuits are needed in such a turbo decoder architecture for a sixteen state code. The parallel computation of the alpha and beta functions effectively increases the decoding speed of the turbo decoder by a factor of thirty-two over a serial approach.

Each alpha and beta computational circuit requires two values of the alpha (or beta) function at the previous time instant. The two previous values are dependent on the trellis of the code. If the code is recursive systematic with binary inputs, then there are two valid transitions into and out of each state. Furthermore, if the memory of the code is fixed, then the two state probability estimates required for either the alpha or beta recursions are fixed. Since this connectivity is known, the feedback portion of the alpha (or beta) circuit can be hard-wired. In general, the alpha and beta circuits require different connections, however.

Each of the alpha and beta computational circuits also requires two of the gamma values that have been calculated in the gamma calculator 30 (FIG. 2). The four possible gamma values from the gamma calculator are available to each alpha and beta circuit 40 (FIG. 3). Selection of the appropriate gamma value used in the alpha and beta circuits is performed using selection switches TS(m,k), represented by number 44, and TP(m,k), represented by number 46. The switches TS(m,k) determine the systematic bit contribution; and switches TP(m,k) determine the parity bit. The switches TS(m,k) are also used to determine which of the two hard-wired alpha (or beta) values of the previous trellis level are multiplied by the selected gamma values in the current trellis level update.

The alpha and beta blocks also include a normalization circuit 48. The function of the normalization circuit is to monitor the values of the alpha (beta) function and to assign a scale factor such that all values at a trellis level remain within the precision limits of the particular system. The normalization function is preferably implemented in such manner that the computation of each normalized value is performed in parallel with the alpha (beta) calculation, as described hereinbelow.

The initialization circuit involves setting the initial state probabilities to known values at the start of the recursions. The convention used herein is that state 0 has probability 1 upon initialization; all other states are initialized with probability 0.

Figure 4A:
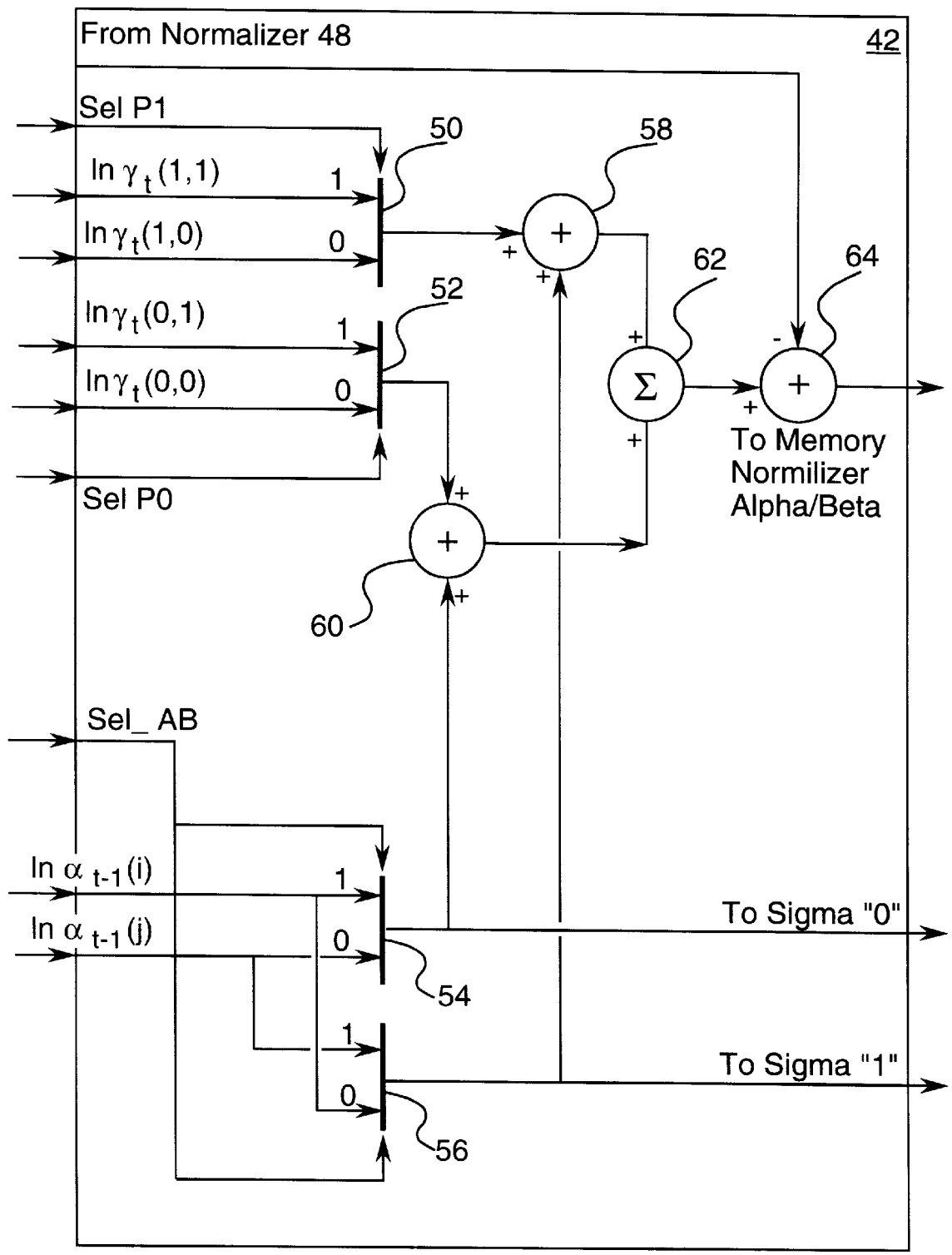
FIG. 4a is a block diagram illustrating an alpha update circuit of FIG. 3 according to a preferred embodiment of the present invention.
Figure 4B:
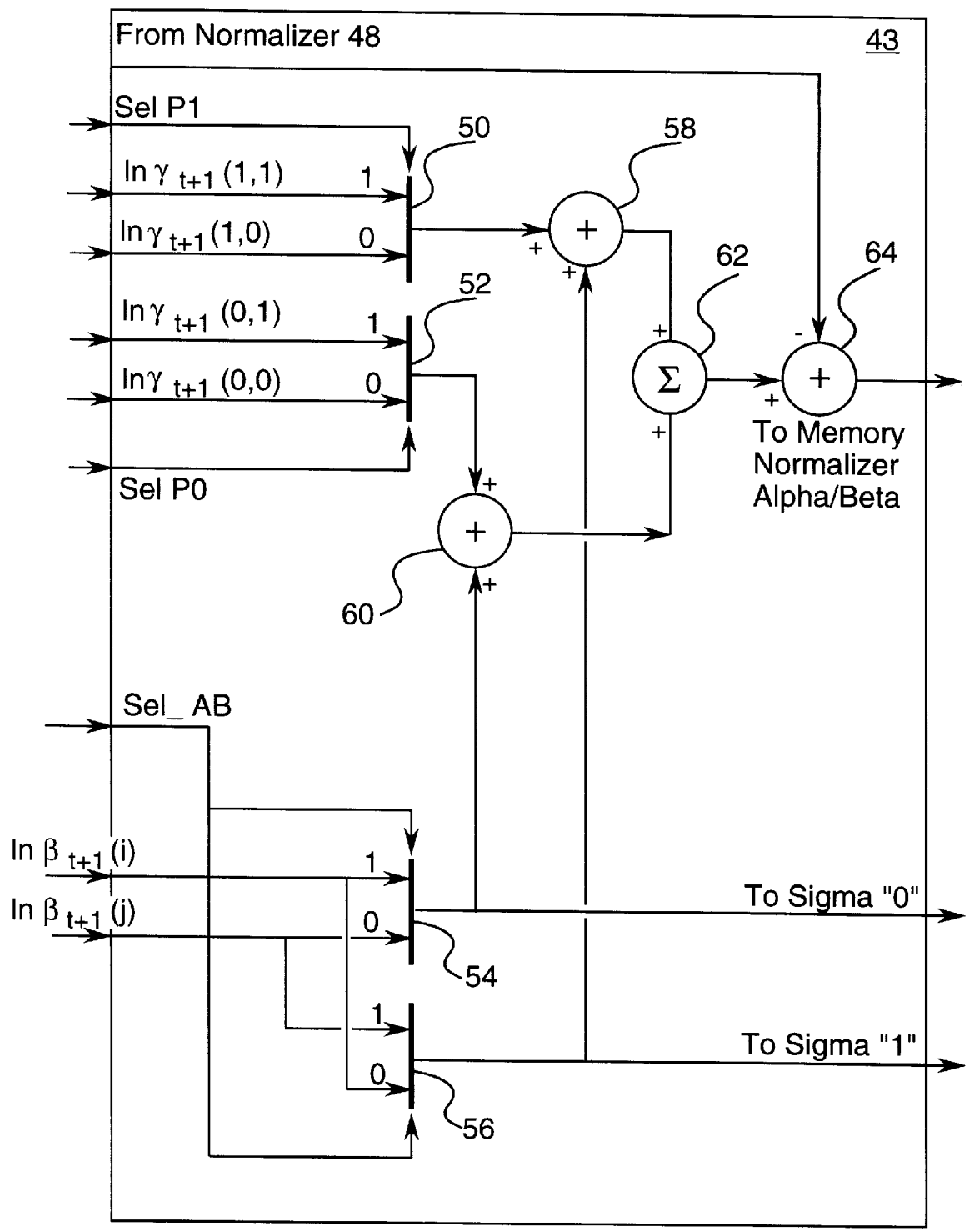
FIG. 4b is a block diagram illustrating a beta update circuit of FIG. 3 according to a preferred embodiment of the present invention.

FIG. 4a illustrates one embodiment of alpha recursion update circuit 42; and FIG. 4b illustrates one embodiment of beta recursion update circuit 43. Logarithmic gamma probability function values are provided to a selection switch or multiplexer 50; and the other two logarithmic gamma probability function values are provided to a second selection switch or multiplexer 52. As shown in FIG. 4a, the logarithmic alpha probability function values are provided to two selection switches or multiplexers 54 and 56. Similarly, as shown in FIG. 4b, the logarithmic beta probability function values are provided to the two selection switches. The outputs of switch 50 and switch 56 are provided to an adder 58. The outputs of switch 52 and switch 54 are provided to an adder 60. The results from adders 58 and 60 are provided to a log-addition block 62, with the resultant sum being combined in subtracter 64 with the output of normalizer 48, as shown, the output of which is, in turn, fed back to a memory circuit and the normalizer. The outputs of selection switches 54 and 56 are provided to sigma blocks for the sigma calculations, as described hereinbelow.

Figure 5A:
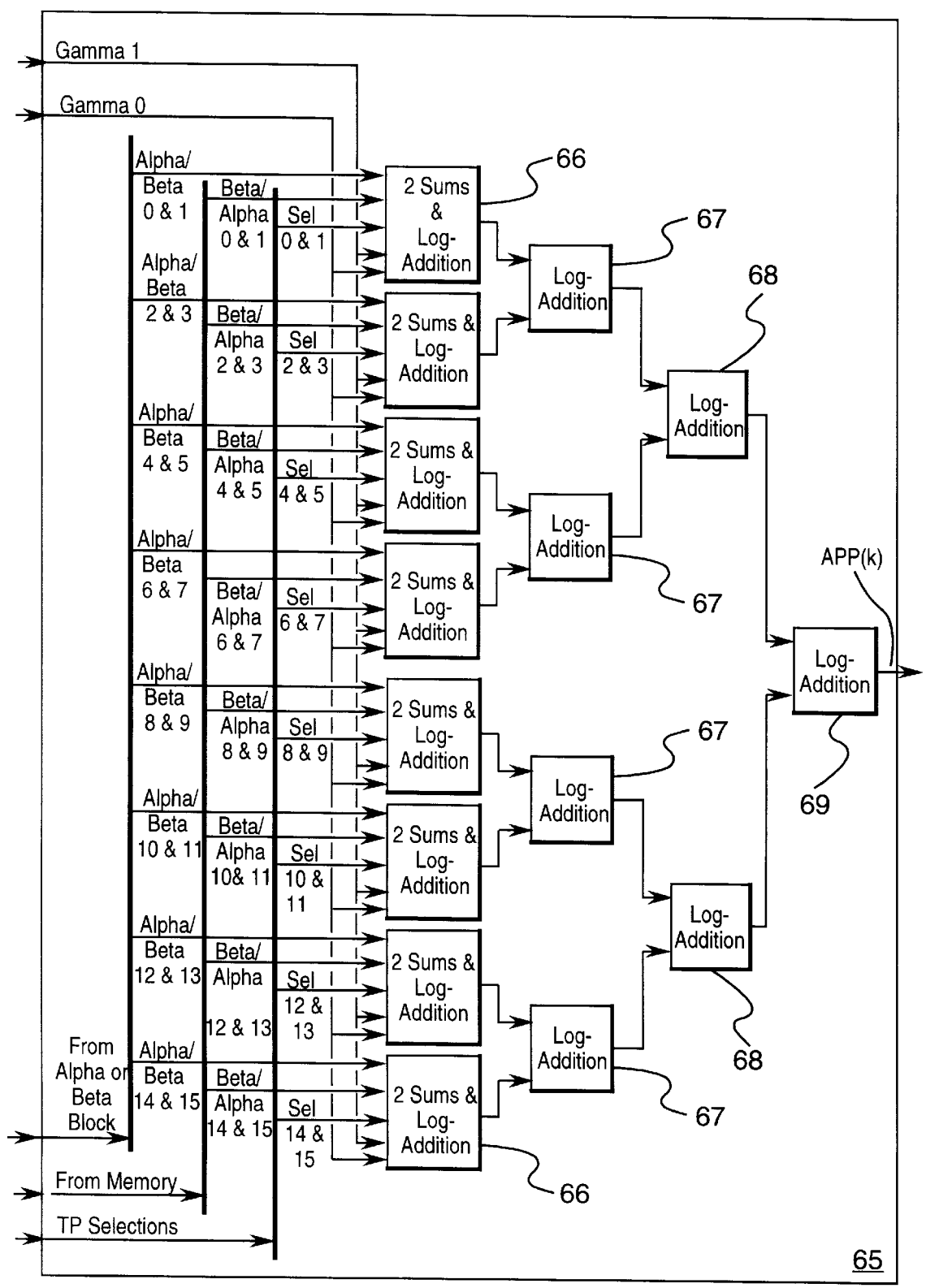
FIG. 5a is a block diagram illustrating a sigma calculator of a turbo decoder according to a preferred embodiment of the present invention.

The outputs of the alpha and beta blocks are buffered and used as inputs to the sigma calculation (or sigma-AP) blocks 65, as illustrated in FIG. 5a.

The a posteriori bit probabilities are computed as the sum of a number of sigma values as follows:

$$APP_t(k)=\Sigma\tau_t(m',m), \qquad 19$$

where the sigma values are computed using the following:

$$\tau_t(m',m)=\alpha_{t-1}(m')\cdot y_t(m',m)\cdot\beta_t(m) \qquad 20$$

In calculating the a posteriori probabilities, it is desirable to minimize the time for calculating the sigma values of equation 20 and the summation of equation 19. Since the alpha and beta recursions begin at opposite ends of the code word, there is insufficient information available to compute the sigma values until each recursion is half finished. At such time, all of the sigma values which are functions of the alpha and beta values at trellis indices $t_R$ and $T_L$ can be calculated. For a sixteen-state recursive systematic code, there are sixty-four such values. Fortunately, these can be grouped naturally into four categories using equation 19. In a recursive systematic code with sixteen states, there are sixteen elements in the summation. Since the bit indices are either 0 or 1, if the trellis level index for the alpha recursion is $t_R$ and the trellis level for the beta recursion is $T_L$, four circuits can operate in parallel in order to compute the summation of equation 19. The four summations simultaneously compute $APP_{t_R}(0)$, $APP_{t_R}(1)$, $APP_{t_L}(0)$ and $APP_{t_L}(1)$.

The sigma calculations also require gamma values. For this operation, there are two gamma calculators which calculate and supply the sigma-AP block with the four possible gamma values for the trellis indices $t_R$ and $T_L$ Again, matching of the appropriate alpha, beta, and gamma values in equation 20 is performed with selection switches TP(m,k) and TS(M,k) described hereinabove.

FIG. 5a illustrates a logarithmic implementation of a sigma-AP block 65. In particular, a logarithmic implementation of equation 20 requires two sums. Then, there are fifteen pipe-lined logarithmic adders to perform the summation of equation 19. Structurally, each block 66 includes one log-addition function, eight additions thus being performed in parallel. Blocks 66 are followed by two pairs of parallel log-addition blocks 67, the output of each pair being provided to another log-addition block 68. The outputs of the two log-addition blocks 68 are then provided to the fifteenth log-addition block 69.

Figure 5B:
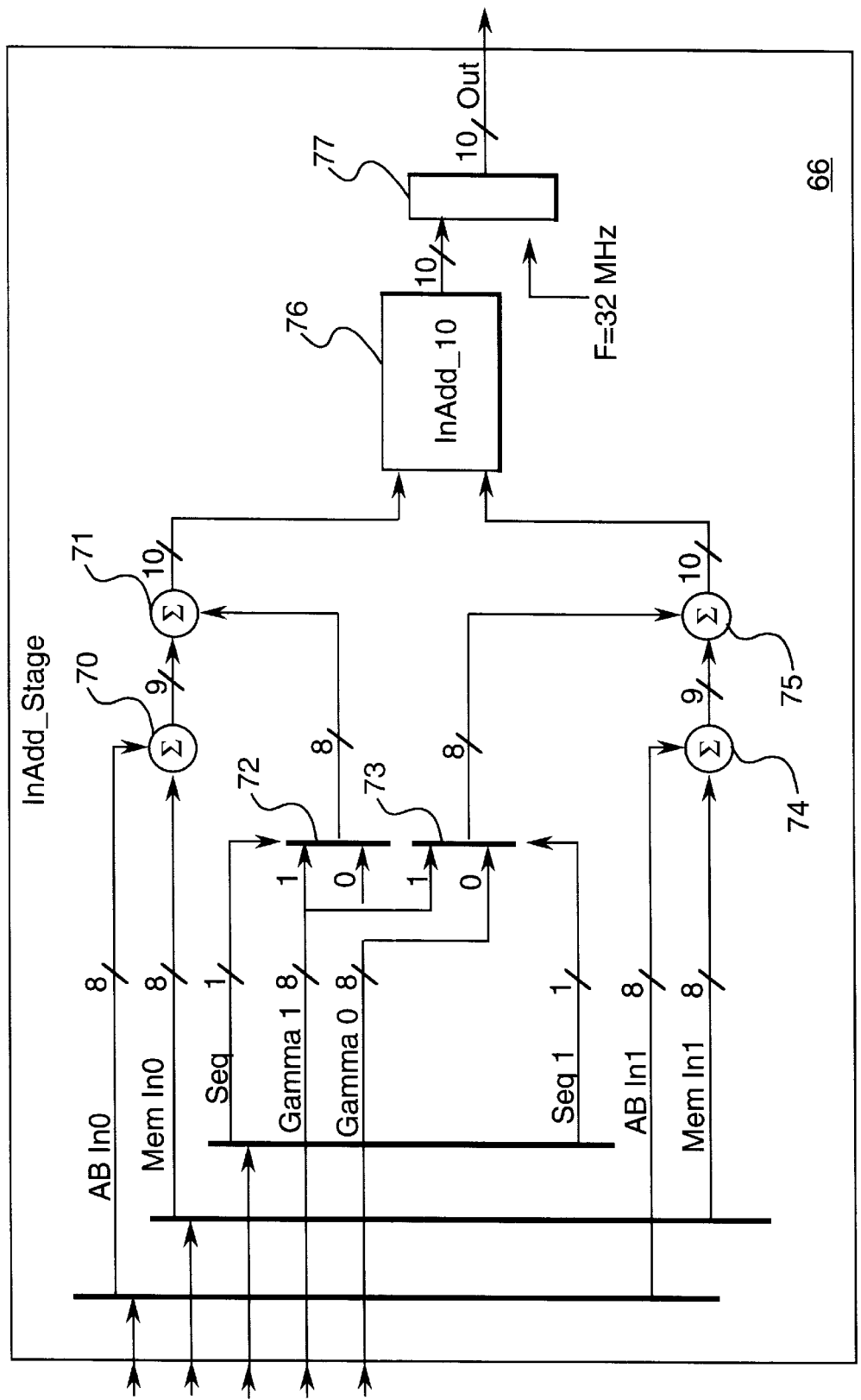
FIG. 5b is a block diagram illustrating a 2-Sums-and-Log-Addition Block 66 for the sigma calculator of FIG. 5a in more detail.

FIG. 5b illustrates a 2-Sums-and-Log-Addition block 66 of FIG. 5a in more detail. The present alpha or beta function value and the corresponding value from memory are provided to a summer 70. The output of summer 70 is provided to a second summer 71 along with the appropriate gamma value chosen by multiplexer 72. Similarly, in the illustrated lower path, the present alpha or beta function value and the corresponding value from memory are provided to a summer 74, the output of summer 74 being provided to another summer 75 along with the appropriate gamma value chosen by multiplexer 73. The outputs from summers 71 and 75 are provided to a log-addition block 76, the output of which is clocked by a register 77.

Figure 5C:
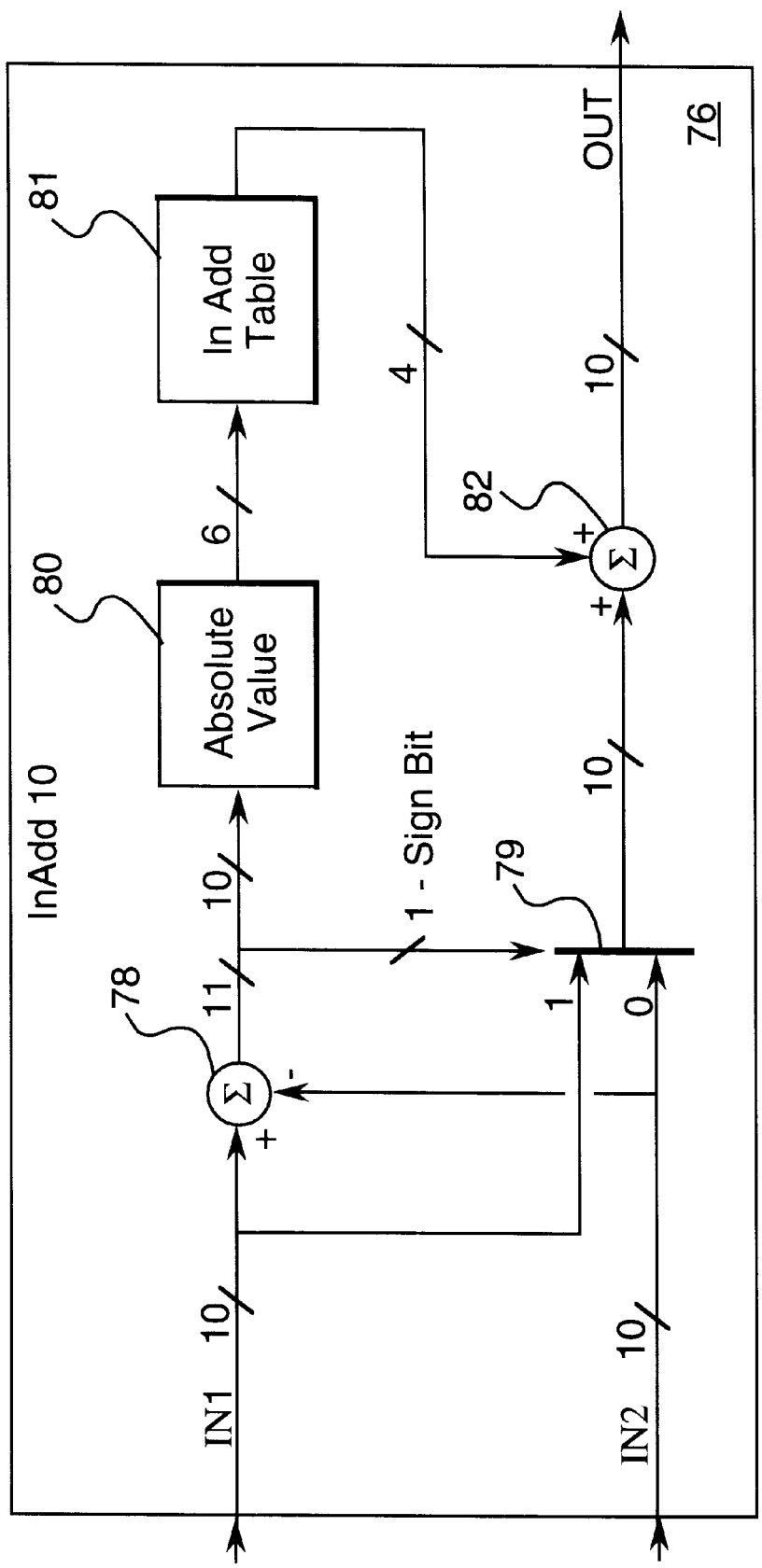
FIG. 5c is a block diagram illustrating a logarithmic adder (i.e, log-addition block 76 of FIG. 5b and log-addition blocks 67, 68 and of FIG. 5a) in more detail.

FIG. 5c illustrates a log-addition block suitable for implementation as log-addition block 76 of FIG. 5b and also as blocks 67, 68 and 69 if FIG. 5a. With respect to block 76, for example, the outputs of summers 71 and 75 are provided as inputs IN1 and IN2, respectively, to block 76. The difference between inputs IN1 and IN2 is determined by a comparator 78, the output of which is provided to an absolute value function block 80. The output of absolute value function block 80 is provided to a log-addition look-up table block 81. A multiplexer 79 also receives inputs IN1 and IN2 and selects the appropriate input for addition in adder 82 to the output of the look-up table block 81. The resultant sum is the output of the log-addition block.

FIG. 6 is a top level view illustrating data flow in the turbo decoder 10. Each block, or functional unit, has a specific function to perform and can be built and tested as a separate unit. The blocks within the turbo decoder in the data path are the gamma block 90, the alpha and beta blocks 40, and the sigma-AP blocks 65, as described hereinabove.

The gamma block 90 includes data interfaces to the user. The gamma block contains the four gamma calculator circuits 30 (FIG. 2). The gamma block also has sufficient memory to store the received samples for the code word and to store a calculated a posteriori probability for each data symbol (i.e., systematic bit) within the code word.

Figure 7:
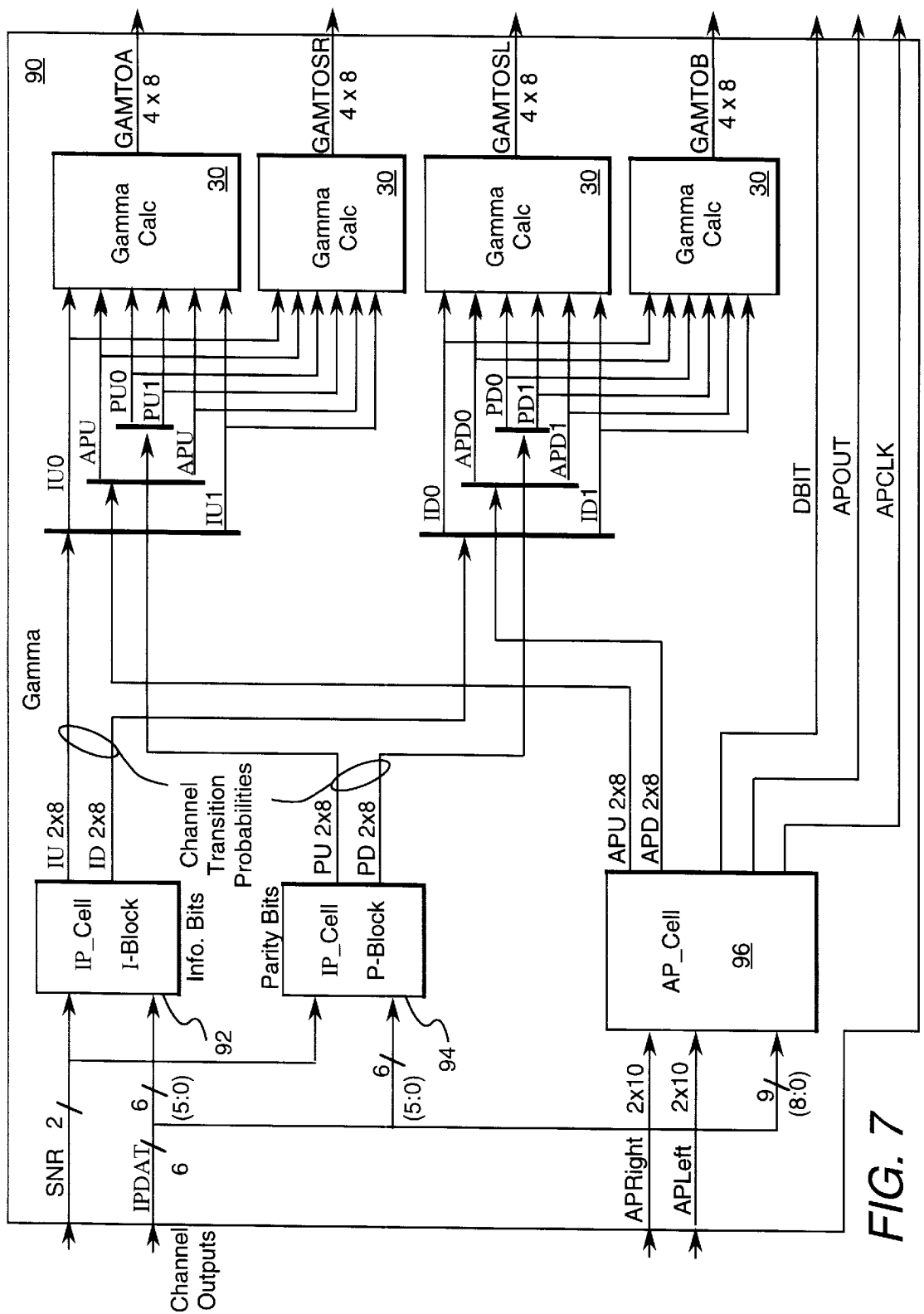
FIG. 7 is a block diagram illustrating a gamma block according to preferred embodiments of the present invention.

FIG. 7 illustrates gamma block 90 in more detail. IP cells 92 and 94 convert received symbols (IPDAT) from the channel into the negative of the logarithm of each respective channel transition probability. The other illustrated input, SNR (signal-to-noise ratio), is a parameter that selects one of four tables, for example, which implement the function of the block. An AP cell 96 receives as inputs the outputs of the sigma block. The AP cell takes the difference of the inputs and forms the log likelihood ratio of the bit value. The log likelihood ratios are stored in the AP cell. The outputs of the AP cells are as follows: the transformed inputs (i.e., the negative of the logarithms of the two input probabilities); the sign bit DBIT (i.e., the hard decision output of the decoder); and the soft-decision output APOUT (i.e., the log likelihood ratio). The outputs of the IP cells and the AP cell are then utilized by the gamma calculator circuits 30, as described hereinabove with reference to FIG. 2.

Referring back to FIG. 6, the alpha and beta blocks 40 calculate the alpha and beta vectors in the turbo decoding algorithm. In particular, as shown, there is a separate block for computing the alpha functions and a separate block for computing the beta functions. Computations of the alpha and beta values involve recursive operations, each beginning at one end of the component code word and continuing until the other end. The difference between the alpha and beta calculations is that they begin at opposite ends of the code word. The recursion is defined by the trellis of the channel code. The recursions for the alpha and beta blocks are slightly different because the trellis appears different depending on the direction in which it is traversed; that is, the connections are not symmetrical about a set of nodes. The inputs to the alpha and beta blocks are the gamma probability function values (i.e., the symbol-by-symbol a posteriori state transition probability estimates), which are generated in the gamma block 90. The outputs of the alpha and beta blocks are the alpha and beta vectors. The alpha and beta vectors are required in the sigma blocks 65. The alpha and beta blocks contain enough memory to store the alpha or beta vectors for half the code word.

There are four sigma blocks 65 which calculate the sigma values for the transitions in the trellis. These blocks also compute an update of the a posteriori probability associated with each of the data (systematic) bits in the code word. The probability of the transmitted bit being zero is computed simultaneously with the probability of the bit being one. The right-hand and left-hand sides of the code word are computed simultaneously. These operations are performed in parallel in order to minimize the delay otherwise due to serial sigma block calculations. The inputs to the sigma block are the gamma values, computed by the gamma block, and the alpha and beta vectors, computed in the alpha and beta blocks.

Optimization of Critical Alpha/Beta Path

In a recursive systematic code, only two of the $\gamma_t(m',m)$ values are non-zero; therefore, an update of either an alpha or beta value involves a parallel multiplication followed by an addition. Then, division by a normalization value ensures that the sum of all the state probabilities are maintained within the precision limits of the system. The basic operations required for an update of the alpha recursion are set forth in the equation that follows:

$$\alpha_t(m) = (\alpha_{t-1}(m') \cdot \gamma_t(m,m') + \alpha_{t-1}(m'') \cdot \gamma_t(m,m''))/\eta_t \qquad 21$$

where $\eta_t$ is the normalization factor at trellis level t. The calculation of the normalization value $\eta_t$ is data dependent. The normalization value is ideally is a function of all the state probabilities at time t However, such an implementation would significantly limit decoding speed since the time taken to calculate $\eta_t$ would be added to the computation time of equation 21. Advantageously, a preferred implementation uses past values of the state probabilities to prescribe a current normalization value, thus removing calculation of the normalization value from the critical path circuit, as described hereinbelow.

As indicated hereinabove, a logarithmic version of the MAP algorithm is preferred. Advantages of the use of logarithms include the following: (1) fewer bits of precision are required to obtain the same turbo decoder performance; and (2) multiplication becomes addition in the logarithmic domain.

A typical logarithm base useful in the log-MAP algorithm is $16^{\sqrt{e}}$. Some properties of logarithms useful in the log-MAP algorithm are:

$$\ln(A \cdot B) = \ln(A) + \ln(B) \quad \ln(A|B) = \ln(A) - \ln(B) \qquad 22$$

and $$\ln(A + B) = \ln\{\exp[\ln(A)] + \exp[\ln(B)]\} \qquad 23$$

$$= \ln\{\exp(\ln(A) \cdot [1 + \exp[\ln(B)]/\exp[\ln(A)]]\}$$

$$= \ln[\exp(\ln(A)] + \ln[1 + \exp[\ln(B) - \ln(A)]]$$

$$= \ln(A) + \ln[1 + \exp[-(\ln(A) - \ln(B))]]$$

$$= \ln(B) + \ln[1 + \exp[-(\ln(B) - \ln(A))]]$$

$$= \max(\ln(A), \ln(B)) + \ln[1 + \exp[-|\ln(A) - \ln(B)|]]$$

The last line of equations 23 can be interpreted as performing a select-largest-value function, followed by a correction factor that is dependent on a difference of two numbers. The correction factor may be implemented using a look-up table. Fortunately, with finite precision arithmetic, there are only about sixty non-zero values for the function $\ln[+\exp[-|\ln(A)-\ln(B)|]]$ when the base of the logarithm is $^{16}\sqrt{e}$.

The logarithmic equivalent of equation 21 is $$\ln[\alpha_t(m)] = \max[\ln(\alpha_{t-1}(m')) + \ln(\gamma_t(m,m')), \ln(\alpha_{t-1}(m'')) + \ln(\gamma_t(m,m''))] + \ln[1+\exp(-|[\ln(\alpha_{t-1}(m')) + \ln(\gamma_t(m,m'))] - [\ln(\alpha_{t-1}(m'')) + \ln(\gamma_t(m,m''))]|)] - \ln(\pi_t) \qquad 24$$

Figure 8A:
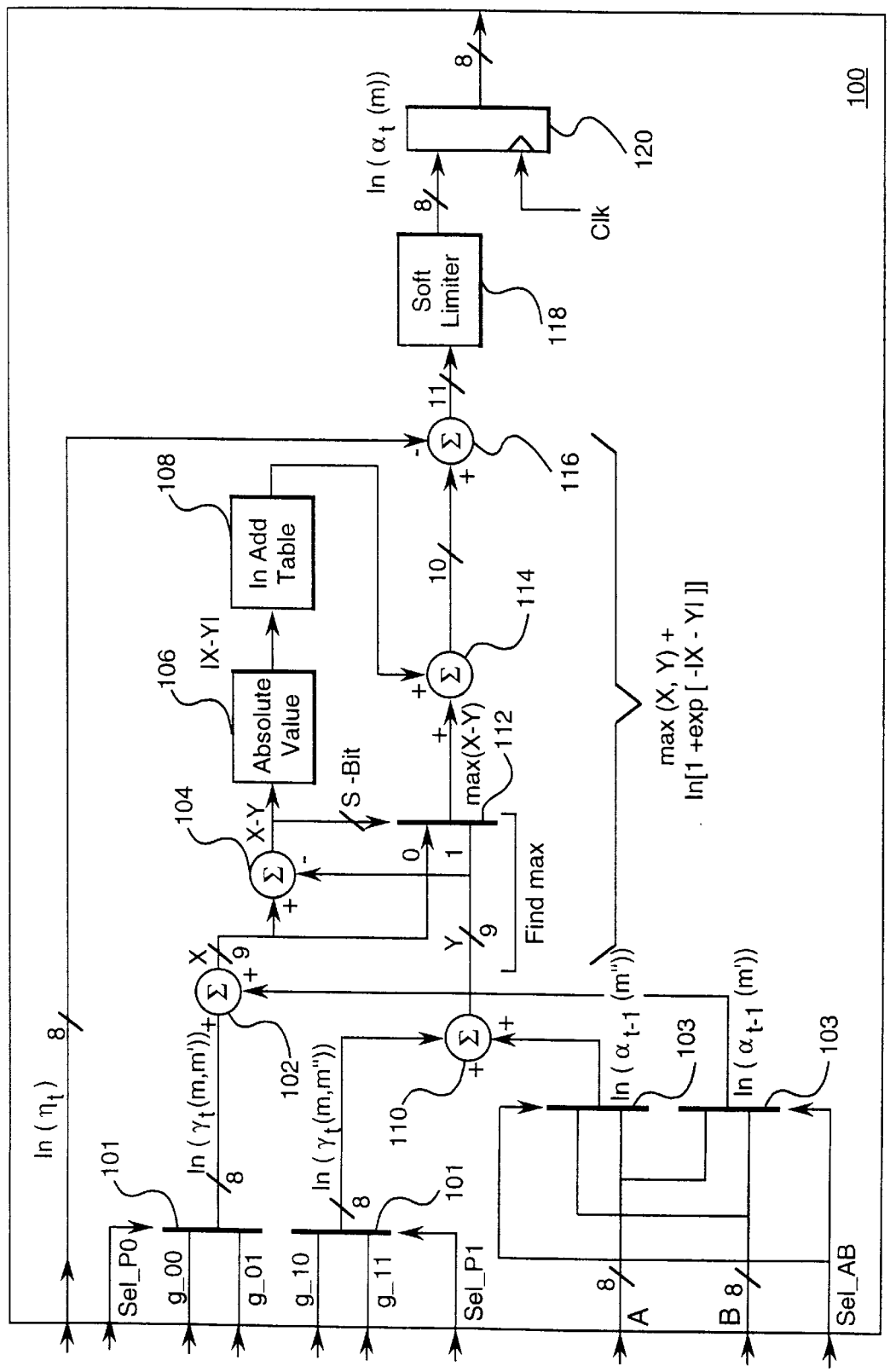
FIG. 8a is a block diagram illustrating a circuit for updating alpha and beta recursions according to a preferred embodiment of the present invention.
Figure 8B:
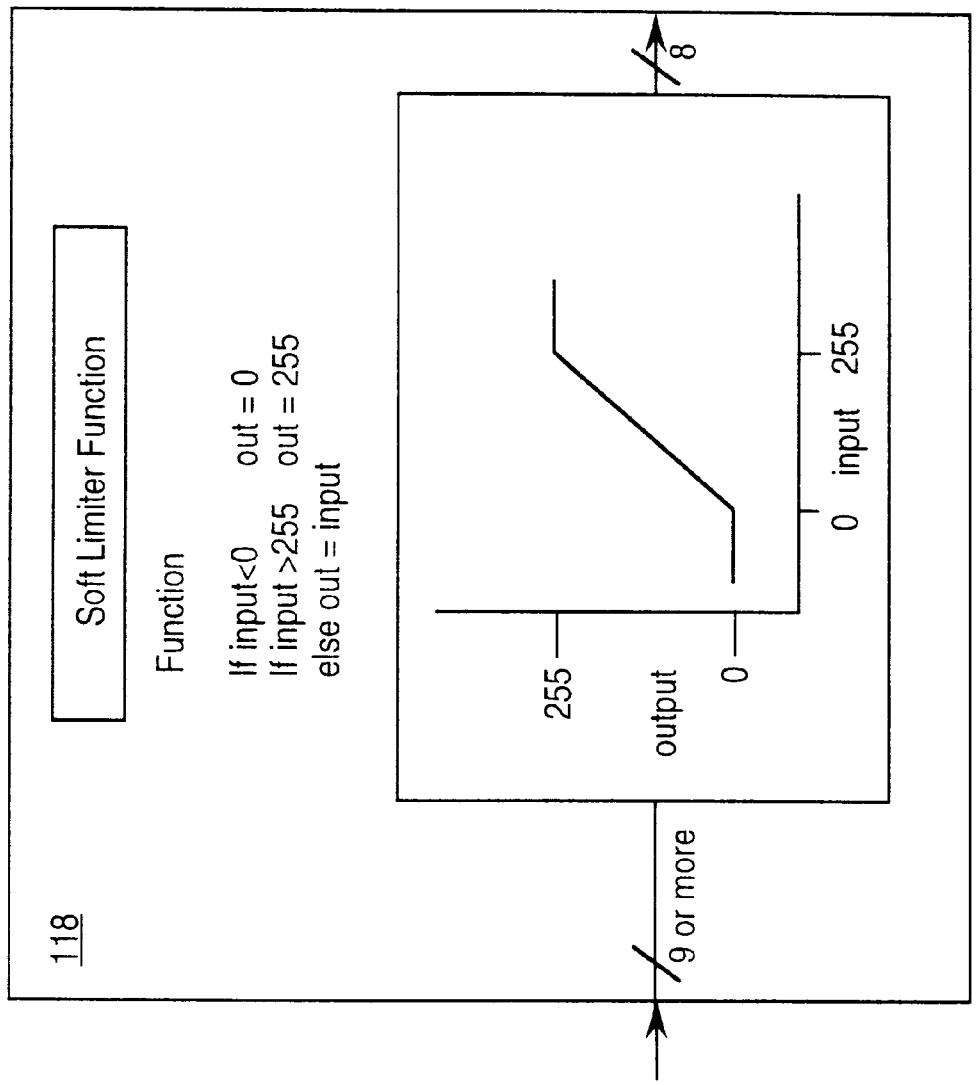

FIG. 8a illustrates an alpha and beta recursion update circuit 100 for implementing equation 24. This circuit for calculating the max(ln(A),ln(B))+ln[1+exp[1−ln(A)−ln (BA|]] function has two parallel paths. The top path involves multiplexers 101 for choosing two gamma values, summers 102 and 104, and an absolute value function 106 followed by a table look-up function 108. The bottom path involves multiplexers 103 for choosing the alpha (A) and beta (B) values, a summer 110, and a multiplexer 112. The two paths meet in a summer 114. Following this, normalization is performed using a subtracter 116. The output of subtracter 116 is provided to a soft-limiter function 118, which is illustrated in more detail in FIG. 8b. The alpha and beta recursion updates are provided via register 120.

Figure 9:
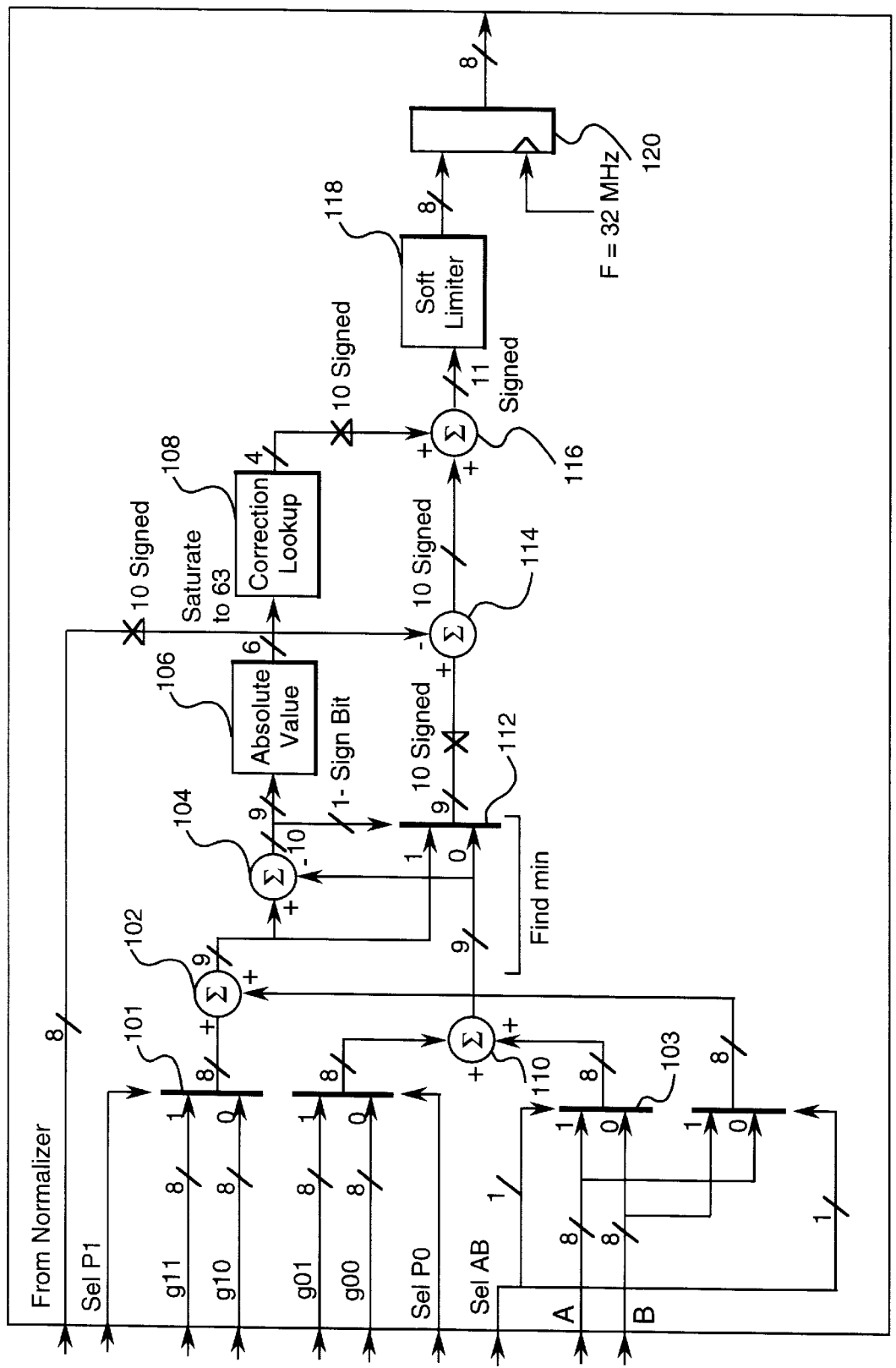
FIG. 9 is a block diagram illustrating an alternative embodiment of the alpha and beta recursion update circuit of FIG. 8.

FIG. 9 illustrates an alternative embodiment of the circuit of FIG. 8a. One difference between the circuits of FIG. 8a and FIG. 9 is the use of unsigned integer addition for adders 102 and 110. Since MAP algorithm quantities are probability estimates, their values lie between 0 and 1, and the logarithms of these probability estimates are bounded on the interval [−∞, 0]. Consequently, the sign bit required for signed integer arithmetic can be discarded, and unsigned arithmetic can be performed. This reduction in integer word size reduces the processing time for the addition cells, thereby increasing speed of operation of the circuit. It also reduces the size of the multiplexers.

Another difference in the circuit of FIG. 9 with respect to that of FIG. 8a is that the maximization (max) function has been converted to a minimization (min) function because negative numbers are represented as positive integers in this circuit.

A further difference between the embodiments of FIG. 8a and FIG. 9 involves the correction factor $\ln[1+\exp[-|\ln(A)-\ln(B)|]]$. The correction factor is always a positive value. But since numbers according to the log-MAP algorithm are negative logarithms, this correction factor must be subtracted from the output of the min function. Advantageously, however, this subtraction operation has been converted to an addition function. In particular, the values in the table that must be subtracted for the logarithmic base of $^{16}\sqrt{e}$ range from 0 to 11. If the table is biased by −11, then the values that must be subtracted range from −11 to 0. Mathematically, this is equivalent to loading the table 108 with the negative of the correction value (a positive number) and performing an addition. Since addition is faster than subtraction, a speed improvement results. The bias can be removed by biasing the normalization value by 11.

The look-up table values for table 108 can be implemented as either a RAM (random access memory) or ROM (read only memory) cell. Alternatively, since the correction values are a monotonic function, they can be implemented using combinatorial logic rather than an actual table. Since the number of non-zero values in the table (before biasing) is less than sixty-four, the input to the circuit would only have six bits. Straight-forward logic implementation of the table could save both area and access time and thus further contribute to improved efficiency and performance in the critical alpha and beta path.

The speed of the circuit has been improved further by locating the subtracter 116 for the normalization before the adder 114 in the bottom path. This change in circuit architecture is possible because addition is both commutative and associative. The alpha and beta recursion update circuit of FIG. 9 is faster than that of FIG. 8 ecause adder 116 operates in parallel with elements 104, 106, and 108 rather than in series with them.

Other operations in the critical path involve data conditioning and limiting. Typically, the inputs to the circuit are eight-bit unsigned integers. When two eight-bit integers are added, a nine-bit integer results. Furthermore, since subtraction requires signed numbers, conversion to a signed value is needed before the subtraction. For this case, the correction look-up input must be converted to a six-bit value. Finally, the output of the circuit is converted back to an unsigned integer, and its value is soft-limited so that its maximum value is $2^8 - 1$, or 255.

Multiplexers 112 are used to select gamma function values, and multiplexers 103 are used to select feedback paths. Advantageously, this allows the coder generator to be a programmable parameter of the turbo decoder described herein. If the codes of both the top and bottom decoder are identical and are fixed, then the four multiplexers at the input to the circuit can be eliminated, further increasing speed. In any event, however, for flexibility, four 2:1 multiplexers may be included in the turbo decoder design, as illustrated.

An even greater speed improvement can be achieved by replacing the two's complement absolute value function 106 with a one's complement absolute value approximation, without degrading performance.

Figure 10:
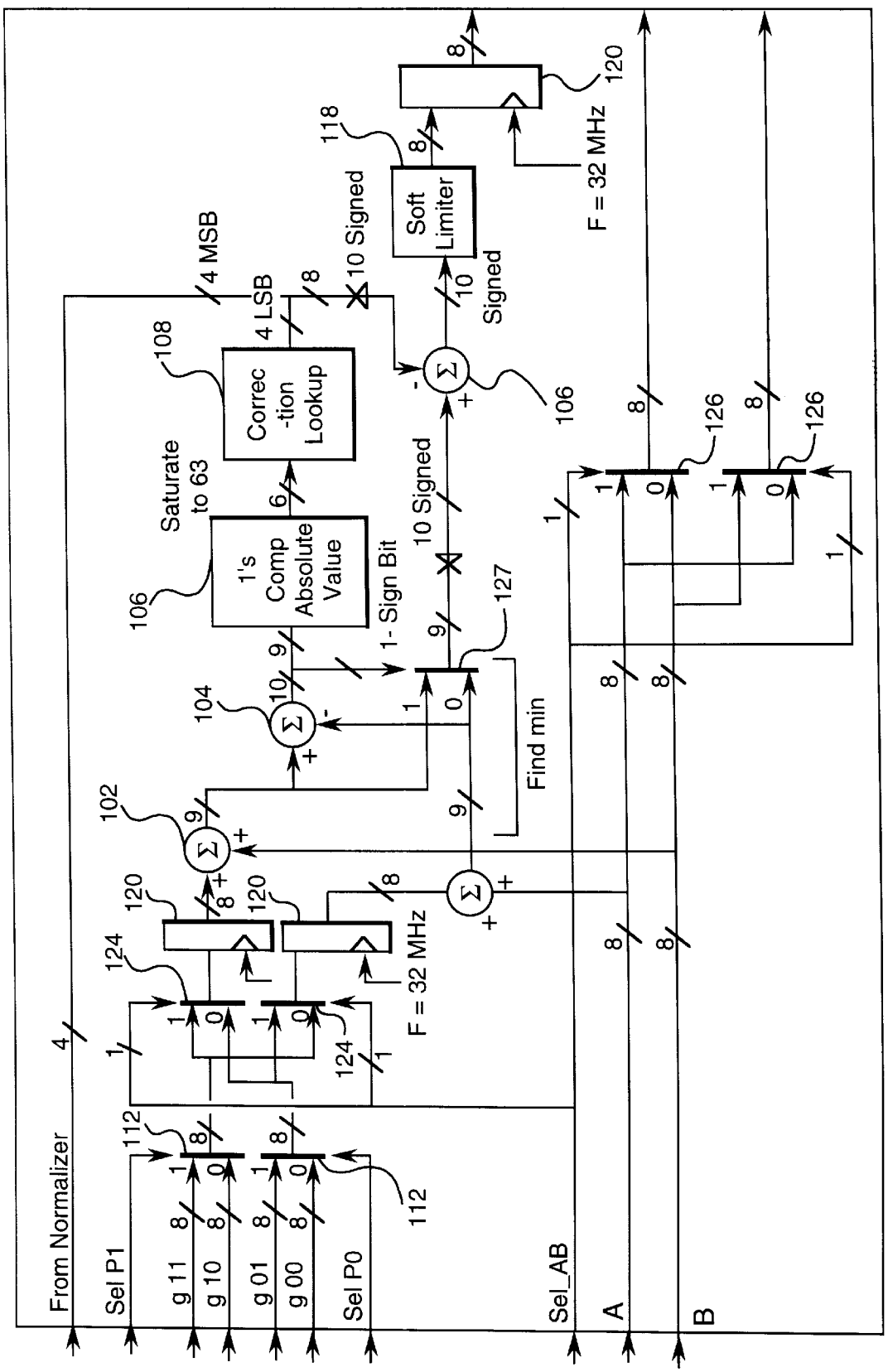
FIG. 10 is a block diagram illustrating another alternative embodiment of the alpha and beta recursion update circuit of FIG. 8.

A further enhancement to the alpha and beta critical path circuit that would increase decoding speed (but would also increase circuit complexity) involves removing the multiplexers 103 which select the feedback path, as illustrated in FIG. 10. Instead, multiplexers 124 are placed in the path of the input gamma values in order to ensure that the proper summations are performed. Since multiplexers are also needed to route the alpha or beta values to the sigma-AP block for the sigma calculations, such multiplexers 126 are located after the summations with the gamma values, and hence are not within the critical path. Registers 120 are placed after multiplexers 124 in the gamma selection path. The additional circuitry thus involves two additional multiplexers and two registers for each alpha and beta update circuit. The added registers increase the throughput delay of the entire data path, but this increase in throughput delay is minimal as compared with the saving in computational speed.

Still another speed improvement involves a modification of the output of the normalization function and the $\ln[1+\exp[-|\ln(A)-\ln(B)|]]$ look-up table so that they can be combined easily prior to being subtracted from the output of the min multiplexer 127, as illustrated in FIG. 10. With these modifications, the bias in the look-up table can be removed and the normalization output can be modified. This is accomplished by truncating the normalization output to the nearest multiple of sixteen such that the least four significant bits are zero. The addition of the four-bit output of the correction look-up function does not require an adder. These modifications effectively remove an adder from the critical path circuit. In FIG. 10, the output of the normalization circuit is shown as a four-bit value instead of an eight-bit value because the four least significant bits are assumed to be zero.

Calculation of the normalization factor involves selecting the lowest of the state probabilities at trellis level t-2 and normalizing the state probability estimates at time t by this value. Previously calculated values of the state probability estimates are used such that the normalization calculation circuit is not in the critical path, as described hereinbelow.

The bias that has been added to the correction function should not be subtracted from $\eta_t$ since the bias is already present in the inputs to the circuit. During the cycles in which the output of the normalization calculation is not used, the bias can be used as the normalization value.

Parallel Implementation of Alpha and beta Normalization

A key element of a preferred embodiment of this turbo decoder invention is the normalization or scaling of the alpha and beta functions' calculated values. This normalization or scaling works together with soft limiting of the alpha and beta functions' values to significantly reduce the dynamic range required for the decoding arithmetic in order to obtain the desired decoding performance. This reduction in dynamic range is manifested in a reduction in the required word widths, i.e., number of bits representing various numerical values in the implementation of the turbo decoding algorithm.

The need for the scaling and soft limiting of alpha and beta function values can be illustrated by an examination of the definitions of these probability functions in equations 3 and 4, respectively. The alpha probability function $\alpha_t(m) = \Pr\{S_t=m; Y_1^t\}$ is the joint probability of the encoder being in state m at time t and receiving the t-symbol sequence $Y_1^t$. Note that $$\sum_m \alpha_t(m) = \sum_m \Pr\{S_t = m; Y_1^t\} = \Pr\{Y_1^t\}. \qquad 25$$

Those with ordinary skill in the art will readily see that $\Pr\{Y_1^t\}$ decreases as t increases. Since $\alpha_t(m)$ must be less than or equal to $\Pr\{Y_1^t\}$ according to the equation above, the alpha function also must decrease as decoding progresses through the trellis (t increases). It is therefore obvious to those with ordinary skill in the art that as the length of a code word increases so does the dynamic range of the alpha probability function.

Similarly, since the beta probability function $\beta_t(m) = \Pr\{Y_{t+1}^\tau | S_t=m\}$ is the conditional probability of receiving the ($\tau$-t)-symbol sequence $Y_{t+1}^\tau$ given that the encoder state at time t is m, these conditional probability estimates decrease as the backward recursion progresses through the trellis ( t decreases), and the dynamic range of the beta probability function increases.

Furthermore, the definitions of the alpha and beta probability functions suggest that the following normalization be used as scaling to reduce the dynamic range of the decoding arithmetic. Since $\alpha_t(m)$ and $\beta_t(m)$ are probability estimates, $0 \leq \alpha_t(m) \leq 1$ and $0 < \beta_t(m) \leq 1$. This implies that $$\frac{\alpha_t(m)}{\sum_m \alpha_t(m)} \leq 1 \quad \text{and} \quad \frac{\beta_t(m)}{\sum_m \beta_t(m)} \leq 1. \qquad 26$$

Figure 11:
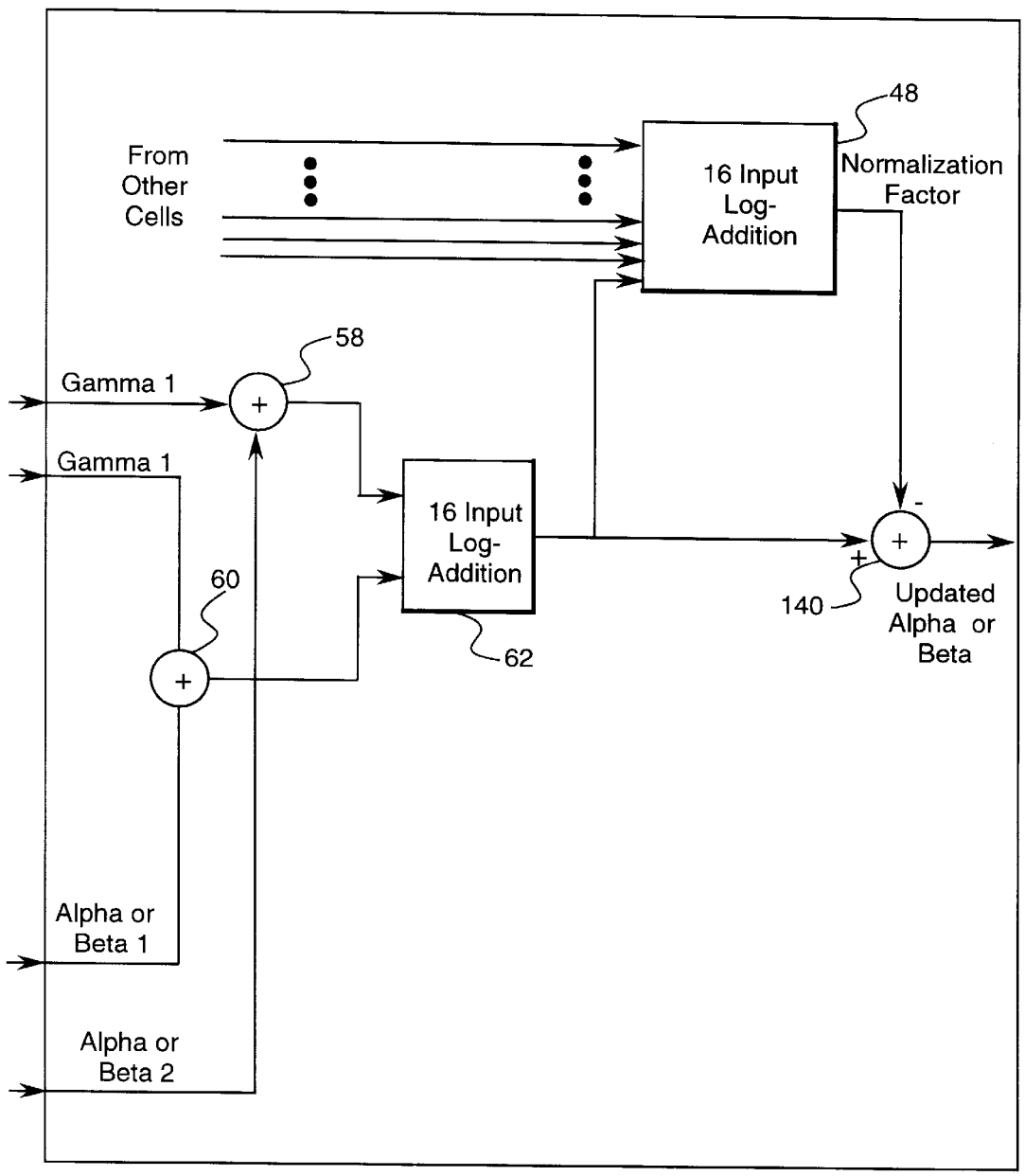
FIG. 11 is a block diagram illustrating one embodiment of the calculation of the alpha and beta recursion, including calculation of the normalization factor and calculations of the alpha and beta values as part of the alpha and beta recursion update circuitry.

Therefore, one embodiment of the invention uses $$\ln\left[\sum_m \alpha_t(m)\right]$$

as the normalization factor for $-\ln[\alpha_t(m)]$ and $$\ln\left[\sum_m \beta_t(m)\right]$$

as the normalization factor for $-\ln[\alpha_t(m)]$. That is, the negative of the logarithm of the alpha and beta probability function values are normalized after each recursion. Referring to FIG. 11, this involves calculating the logarithm of the sum of the alpha probability estimates at time t over all the states in log-addition block 48 (which comprises the normalization block 48) and adding the resultant sum to the negative of the logarithm of each alpha probability for trellis level t in subtracter 140. In this embodiment, the normalization of the beta probability values is implemented in an analogous fashion. The probability values are now scaled such that the maximum values of $-\ln[\alpha_t(m)]$ and $-\ln[\beta_t(m)]$ are between 0 and $-\ln[1/M]$, where M is the number of states in the trellis. Unfortunately, however, since computation of the normalization value is dependent on all the state probability estimates, the time required to compute this normalization value must be added to the time required to execute equation 12 or 13. This added execution time can double the total time required to perform the alpha and beta update and thus could potentially halve the decoding speed of the decoder.

In FIG. 11, adders 58 and 60 and log-addition block 62 have been described hereinabove with reference to FIG. 4a. As illustrated, normalization block 48 comprises a 16-input log-addition block which computes the normalization factor. In particular, block 48 comprises a tree-like structure with log-additions being done in pairs of log-addition blocks, exemplary log-addition blocks having structures such as block 76 of FIG. 5c.

As explained hereinabove, in a turbo decoder, the alpha and beta probability estimates are used to compute sigma probability estimates, which, in turn, are used to compute the a posteriori symbol estimates. The difference between the two (APPt(0) and APPt(1)) a posteriori symbol estimates is the log-likelihood ratio, which is the output of the MAP turbo decoder. Advantageously, because of the way that the state probability estimates are used in the turbo decoder, it can be shown that it is not necessary to provide a normalization factor such that the state probability estimates sum to unity. It is only essential to preserve the relative magnitudes. A constant scaling applied to either all the alpha state probability estimates or the beta state probability estimates will not affect the log-likelihood ratio output.

In light of the fact that the value of the scale factor does not affect decoding performance from an algorithmic point of view, the scale factor applied can be advantageously chosen to best match the dynamic range of the probability values to the integer number system utilized in the decoder. Because the most probable paths through the trellis are of greatest interest, a preferred embodiment of the invention uses the largest alpha function value at trellis level t as the scale factor for all $\alpha_t(m)$ in alpha and beta block of FIG. 9. Similarly, the largest beta function value at trellis level t is used as the scale factor for all $\beta_t(m)$ in alpha and beta block in this embodiment of the invention.

Assuming that the rate at which the alpha or beta probability estimates are drifting toward zero probability is much smaller than the dynamic range of the number system used to store the alpha and beta probability estimates (which is typically the case), then it is possible to use past values (i.e., past trellis levels) of the alpha and beta functions to prescribe a current normalization factor. Since past values of the alpha and beta recursions are available earlier, the normalization factor calculation time can be removed from the alpha and beta update circuit. The resulting increase in speed is significant. Hence, the normalization factor is actually an input to the alpha and beta circuit, as opposed to being computed within the circuit itself.

Figure 12:
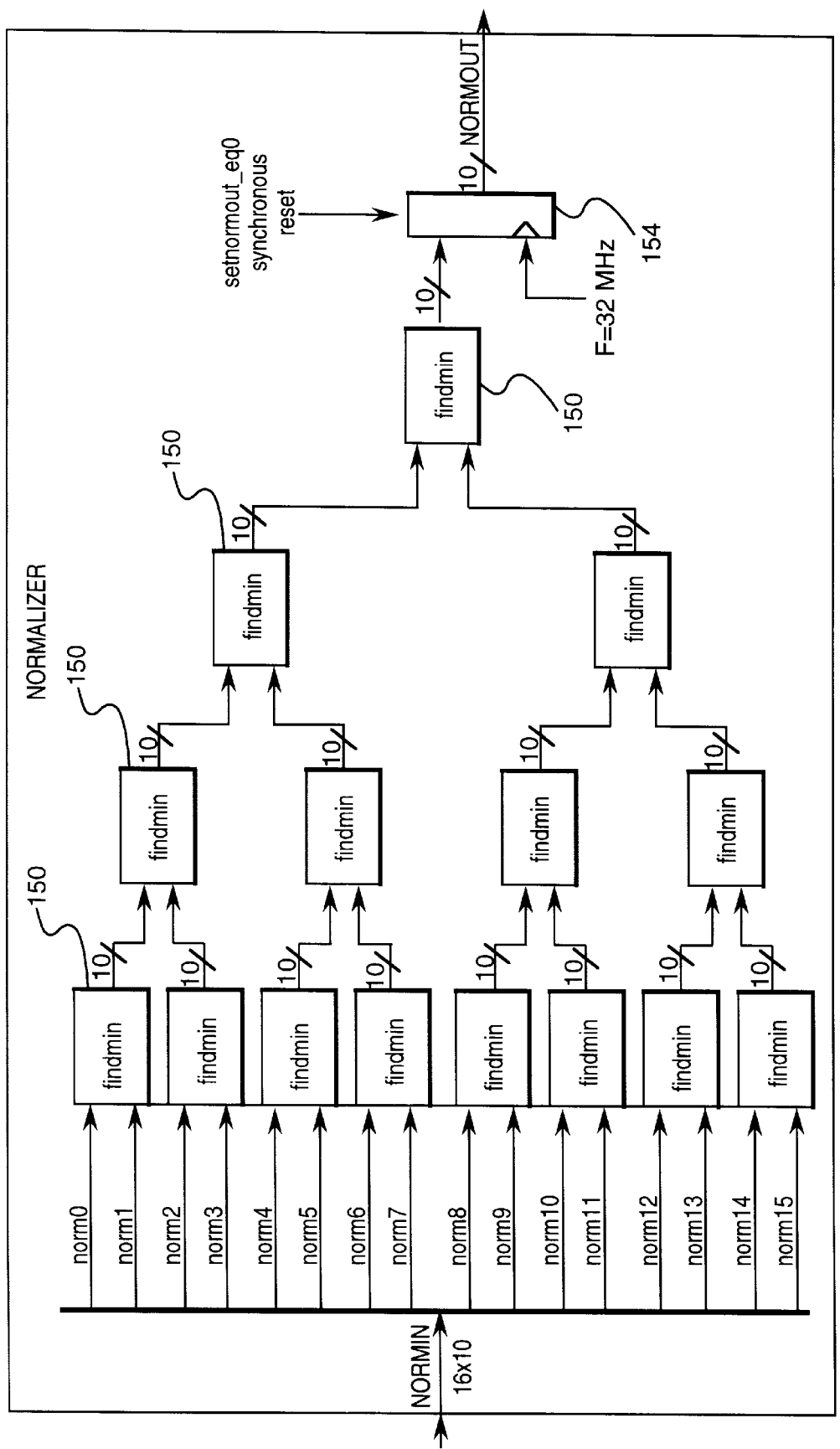
FIG. 12 is a block diagram illustrating an alternative preferred embodiment of the calculation of the normalization factor.

FIG. 12 illustrates an alternative embodiment of a circuit 48 for calculating the scale factor applied to the alpha and beta function values in the alpha and beta update circuit as the minimum of all probability function values input to the circuit. This embodiment of the normalizer 48 (scale factor calculator) comprises a plurality of circuits 150 that output the minimum of two input numbers. These are connected in a series of parallel stages to form a tree-like structure which calculates the minimum of all values input to the scale factor calculator. This minimum value is finally clocked out by a latch 154.

The use of past alpha and beta recursion values of the recursions to prescribe current normalization factors presents an additional source of feedback in the alpha and beta recursions. To limit such feedback, the normalization is preferably only applied every V update cycles, where V is the number of cycles of the alpha (or beta) recursion needed for the normalization calculation, e.g., three. Advantageously, because of the way in which the state probability estimates are ultimately used in the turbo decoder, the periodic application of normalization does not cause any performance degradation therein.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A turbo decoder comprising a plurality of component decoders for decoding component code words of turbo codes, each component decoder comprising:

circuits for receiving and storing received symbols corresponding to a turbo code word;

a gamma block for calculating substantially simultaneously for a plurality of decoder trellis stages a plurality of first and second gamma probability function values, which correspond to the branches of a component code's trellis, the gamma block receiving as inputs the received symbols' channel transition probabilities and a priori bit probabilities for the bits represented by the received symbols, which correspond to the decoder trellis stages;

an alpha block for receiving the gamma probability function values from the gamma block and for recursively calculating alpha probability function values, corresponding to a plurality of trellis state indices, substantially simultaneously by a plurality of circuits, the gamma function values for each alpha probability function value being selected via selection switches, the alpha block further receiving a plurality of alpha probability function values from the previous step of the recursive calculation, the alpha block further comprising circuits for scaling each resultant alpha probability function value substantially simultaneously by a scale factor which is provided as an input to the alpha block;

a beta block for receiving first gamma probability function values from the gamma block and for recursively calculating beta probability function values, corresponding to a plurality of trellis state indices, substantially simultaneously by a plurality of circuits, the gamma function values for each beta probability function value being selected via selection switches, the beta block further receiving a plurality of beta probability function values from the previous step of the recursive calculation, the beta block signal processing further comprising circuits to scale each resultant beta probability function value substantially simultaneously by a scale factor which is provided as an input to the beta block;

a sigma block for receiving the alpha and beta probability function values, respectively, from the alpha and beta blocks, respectively, receiving the second gamma probability function values from the gamma block and receiving a second set of alpha and beta probability function values, respectively, from alpha and beta memories, respectively, and for calculating substantially simultaneously for a plurality of decoder trellis stages a plurality of sigma probability function values which correspond to the branches of a component code's trellis at the trellis stages corresponding to the received symbols, which are being processed at that time, the sigma block also comprising a plurality of pipelined trees of summation functions of all sigma values belonging to each of two subsets of the sigma probability function values for each of the plurality of decoder trellis stages, one subset comprising the sigma function values for trellis branches labeled with a data bit value of zero and the other subset comprising the sigma function values for trellis branches labeled with a data bit value of one, the sigma block calculating the difference of the outputs of the two summation functions for each of the plurality of decoder trellis stages to produce the logarithm of the likelihood ratio of the maximum a posteriori decoded bit value probabilities for each of the plurality of trellis stages as outputs of the turbo decoder;

a plurality of memory cells for storing channel transition probabilities, received symbols, half of the alpha probability function values, half of the beta probability function values, a posteriori and a priori data bit log-likelihood ratios, and a de-interleaving pattern;

a circuit for calculating the negative of the logarithm of the probability that a decoded data bit value is zero from the log-likelihood ratio of data bit value probabilities;

a circuit for calculating the negative of the logarithm of the probability that a decoded data bit value is one from the log-likelihood ratio of data bit value probabilities;

a circuit for making decoded bit decisions from the corresponding log-likelihood ratio; and a circuit for outputting decoded data bits.

* * * * *